(12) United States Patent
Kim et al.

(10) Patent No.: US 12,635,542 B2
(45) Date of Patent: May 19, 2026

(54) MOLDED PACKAGE WITH PRESS-FIT CONDUCTIVE PINS

(71) Applicant: TEXAS INSTRUMENTS INCORPORATED, Dallas, TX (US)

(72) Inventors: Kwang-Soo Kim, Sunnyvale, CA (US); Vivek Arora, San Jose, CA (US); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 767 days.

(21) Appl. No.: 17/900,446

(22) Filed: Aug. 31, 2022

(65) Prior Publication Data

US 2024/0071892 A1     Feb. 29, 2024

(51) Int. Cl.
 H01L 23/498 (2006.01)
 H01L 21/48 (2006.01)
  (Continued)

(52) U.S. Cl.
 CPC .... H01L 23/49838 (2013.01); H01L 21/4825 (2013.01); H01L 21/4839 (2013.01);
  (Continued)

(58) Field of Classification Search
 CPC ........... H01L 23/49838; H01L 23/3121; H01L 23/49811; H01L 23/49822;
  (Continued)

(56) References Cited

U.S. PATENT DOCUMENTS

2009/0194884 A1* 8/2009 Stolze .................. H05K 3/3426
                                              257/E23.024
2012/0319260 A1* 12/2012 Kim .................... H01L 23/4334
                                              257/676
  (Continued)

OTHER PUBLICATIONS

Machine English Translation of JP 2011077280, Power Semiconductor Device and Method of Manufacturing the Same, Sudo et al., published Apr. 14, 20011.*

*Primary Examiner* — Peniel M Gumedzoe
(74) *Attorney, Agent, or Firm* — Dawn Jos; Frank D. Cimino

(57) ABSTRACT

In examples, a method of manufacturing a semiconductor package comprises providing a lead frame having multiple conductive pins coupled thereto; positioning the lead frame within a mold chase and applying a strip of mold compound to the multiple conductive pins along a length of the lead frame; trimming connections between the lead frame and the multiple conductive pins; bending the multiple conductive pins; trimming the strip of mold compound to singulate the multiple conductive pins from each other and from the lead frame to form singulated conductive pins; coupling a singulated conductive pin from among the singulated conductive pins to a substrate such that a portion of the strip of mold compound coupled to the singulated conductive pin is in contact with the substrate and such that a segment of the singulated conductive pin extends vertically in a plane that is orthogonal to the substrate; coupling a semiconductor die to the substrate; and covering the substrate, the semicon-
(Continued)

ductor die, the portion of the strip of mold compound, and part of the singulated conductive pin with a second mold compound, such that a portion of the segment of the singulated conductive pin extends beyond a top surface of the second mold compound.

23 Claims, 45 Drawing Sheets

(51) Int. Cl.
| | |
|---|---|
| *H01L 21/56* | (2006.01) |
| *H01L 23/00* | (2006.01) |
| *H01L 23/31* | (2006.01) |
| *H01L 25/065* | (2023.01) |

(52) U.S. Cl.
CPC ........ *H01L 21/4842* (2013.01); *H01L 21/565* (2013.01); *H01L 23/3121* (2013.01); *H01L 23/49811* (2013.01); *H01L 23/49822* (2013.01); *H01L 23/49861* (2013.01); *H01L 23/49866* (2013.01); *H01L 24/48* (2013.01); *H01L 25/0655* (2013.01); *H01L 2224/48137* (2013.01); *H01L 2224/48225* (2013.01); *H01L 2224/48245* (2013.01); *H01L 2224/48464*

(2013.01); *H01L 2924/1811* (2013.01); *H01L 2924/1815* (2013.01); *H01L 2924/182* (2013.01)

(58) Field of Classification Search
CPC ......... H01L 23/49861; H01L 23/49866; H01L 21/4825; H01L 21/4839; H01L 21/4842; H01L 21/565; H01L 24/48; H01L 25/0655; H01L 2224/48137; H01L 2224/48225; H01L 2224/48245; H01L 2224/48464; H01L 2924/1811; H01L 2924/1815; H01L 2924/182
See application file for complete search history.

(56) References Cited

U.S. PATENT DOCUMENTS

| | | | | |
|---|---|---|---|---|
| 2013/0316551 | A1* | 11/2013 | Day, Jr. .................. | H05K 3/325 |
| | | | | 439/84 |
| 2014/0003013 | A1* | 1/2014 | Yoo ................... | H01L 23/49861 |
| | | | | 361/767 |
| 2016/0262266 | A1* | 9/2016 | Matsumoto .............. | H05K 5/02 |
| 2016/0315022 | A1* | 10/2016 | Egusa ................. | H01R 13/405 |
| 2016/0365306 | A1* | 12/2016 | Lu .................... | H01L 23/49531 |

* cited by examiner

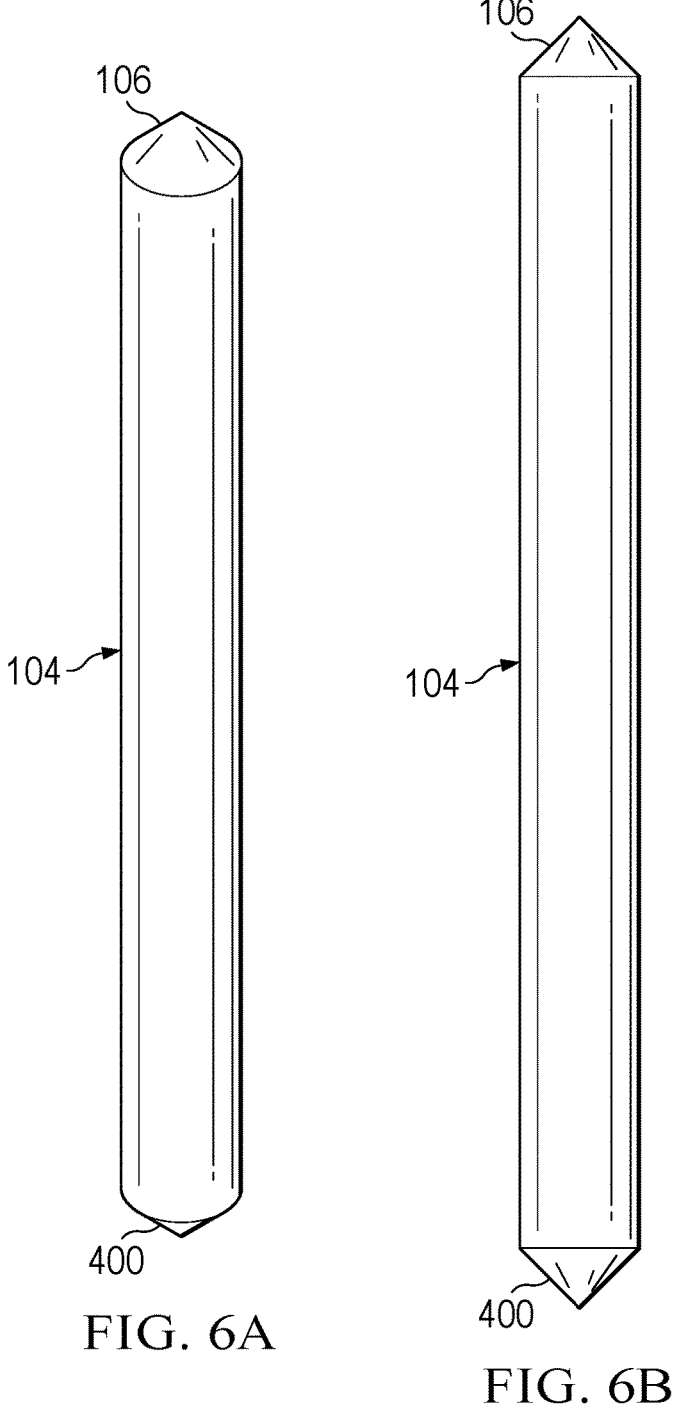
FIG. 6A
FIG. 6B
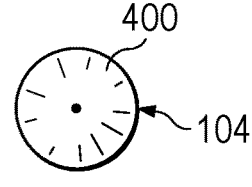
FIG. 6C

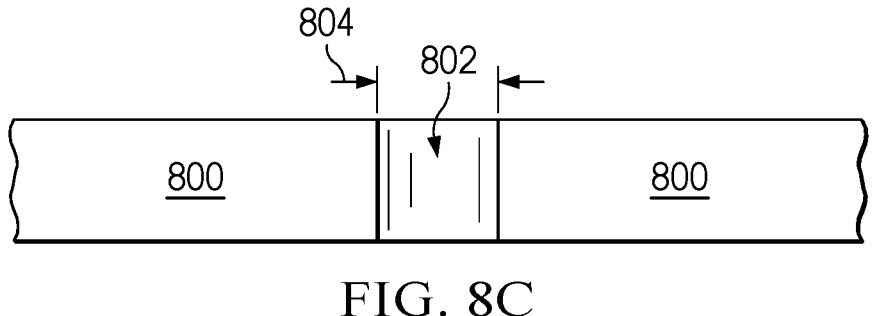

FIG. 8C

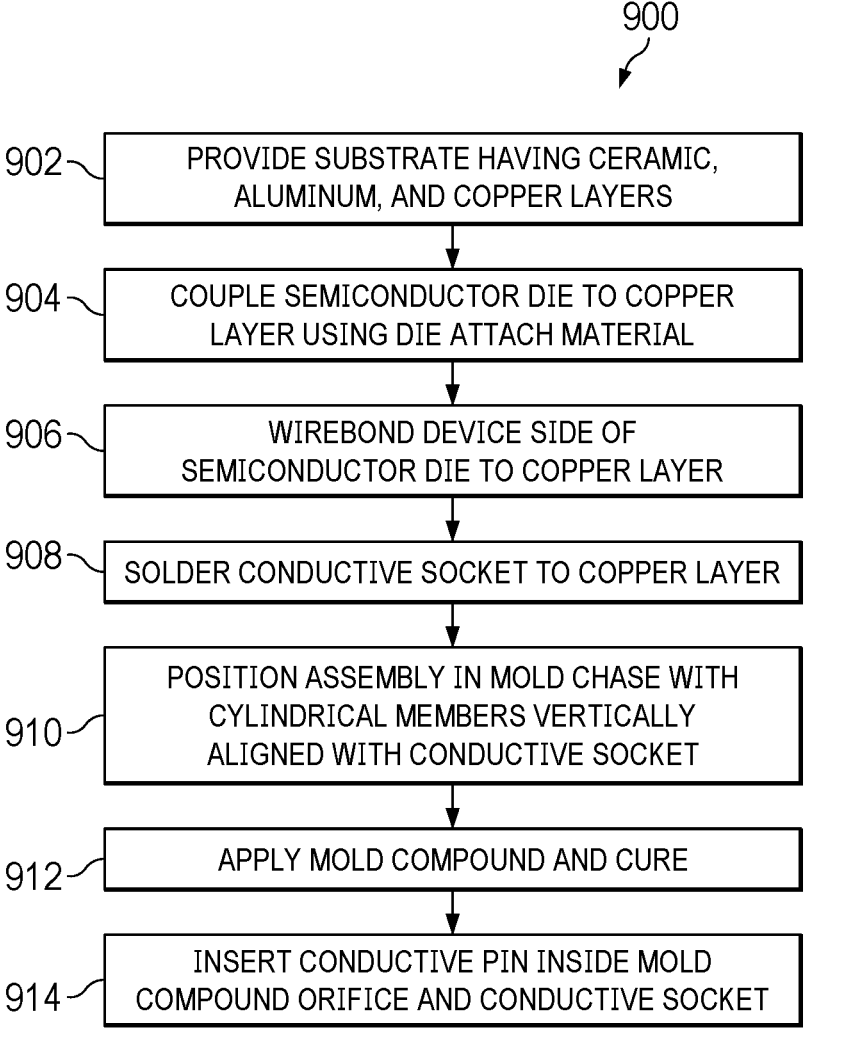

900

902 — PROVIDE SUBSTRATE HAVING CERAMIC, ALUMINUM, AND COPPER LAYERS

904 — COUPLE SEMICONDUCTOR DIE TO COPPER LAYER USING DIE ATTACH MATERIAL

906 — WIREBOND DEVICE SIDE OF SEMICONDUCTOR DIE TO COPPER LAYER

908 — SOLDER CONDUCTIVE SOCKET TO COPPER LAYER

910 — POSITION ASSEMBLY IN MOLD CHASE WITH CYLINDRICAL MEMBERS VERTICALLY ALIGNED WITH CONDUCTIVE SOCKET

912 — APPLY MOLD COMPOUND AND CURE

914 — INSERT CONDUCTIVE PIN INSIDE MOLD COMPOUND ORIFICE AND CONDUCTIVE SOCKET

FIG. 9

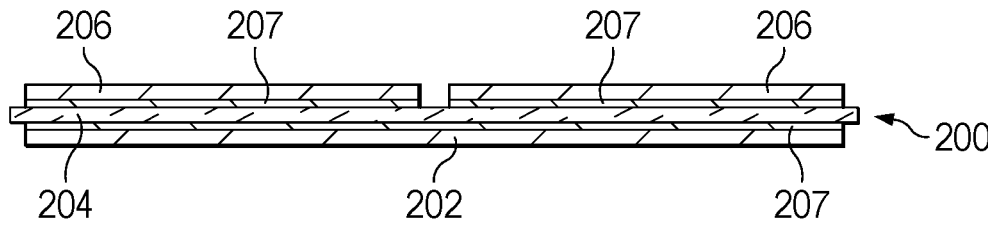
FIG. 10A
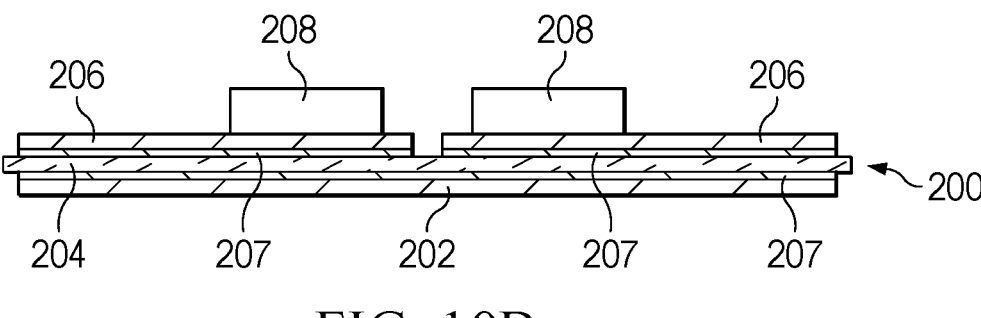
FIG. 10B
FIG. 10C

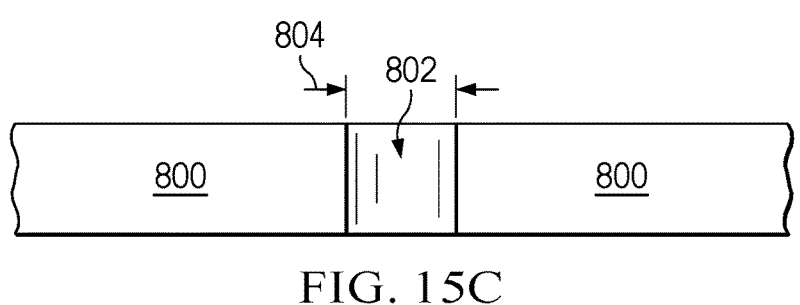

FIG. 15C

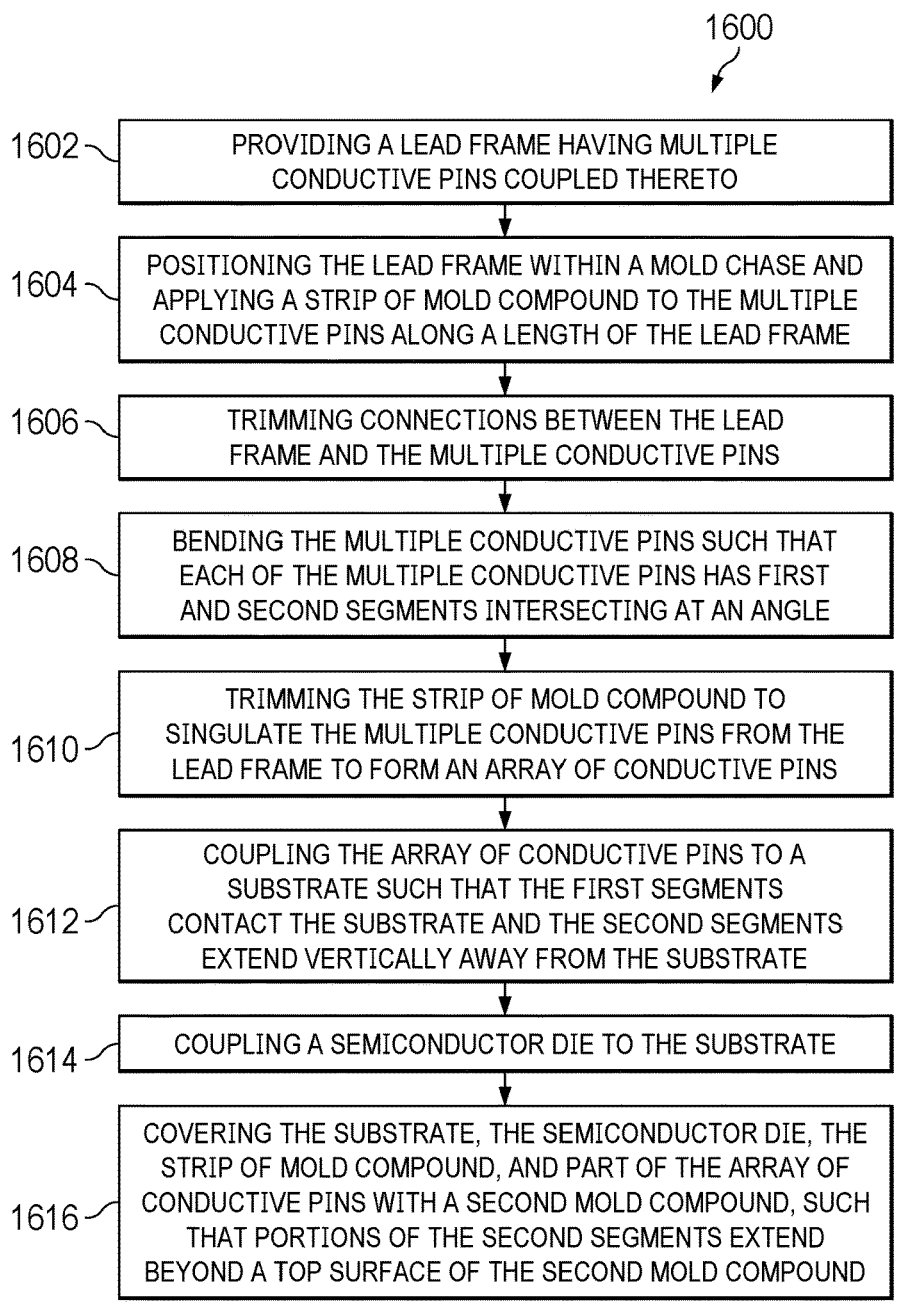

1600

1602 — PROVIDING A LEAD FRAME HAVING MULTIPLE CONDUCTIVE PINS COUPLED THERETO

1604 — POSITIONING THE LEAD FRAME WITHIN A MOLD CHASE AND APPLYING A STRIP OF MOLD COMPOUND TO THE MULTIPLE CONDUCTIVE PINS ALONG A LENGTH OF THE LEAD FRAME

1606 — TRIMMING CONNECTIONS BETWEEN THE LEAD FRAME AND THE MULTIPLE CONDUCTIVE PINS

1608 — BENDING THE MULTIPLE CONDUCTIVE PINS SUCH THAT EACH OF THE MULTIPLE CONDUCTIVE PINS HAS FIRST AND SECOND SEGMENTS INTERSECTING AT AN ANGLE

1610 — TRIMMING THE STRIP OF MOLD COMPOUND TO SINGULATE THE MULTIPLE CONDUCTIVE PINS FROM THE LEAD FRAME TO FORM AN ARRAY OF CONDUCTIVE PINS

1612 — COUPLING THE ARRAY OF CONDUCTIVE PINS TO A SUBSTRATE SUCH THAT THE FIRST SEGMENTS CONTACT THE SUBSTRATE AND THE SECOND SEGMENTS EXTEND VERTICALLY AWAY FROM THE SUBSTRATE

1614 — COUPLING A SEMICONDUCTOR DIE TO THE SUBSTRATE

1616 — COVERING THE SUBSTRATE, THE SEMICONDUCTOR DIE, THE STRIP OF MOLD COMPOUND, AND PART OF THE ARRAY OF CONDUCTIVE PINS WITH A SECOND MOLD COMPOUND, SUCH THAT PORTIONS OF THE SECOND SEGMENTS EXTEND BEYOND A TOP SURFACE OF THE SECOND MOLD COMPOUND

FIG. 16

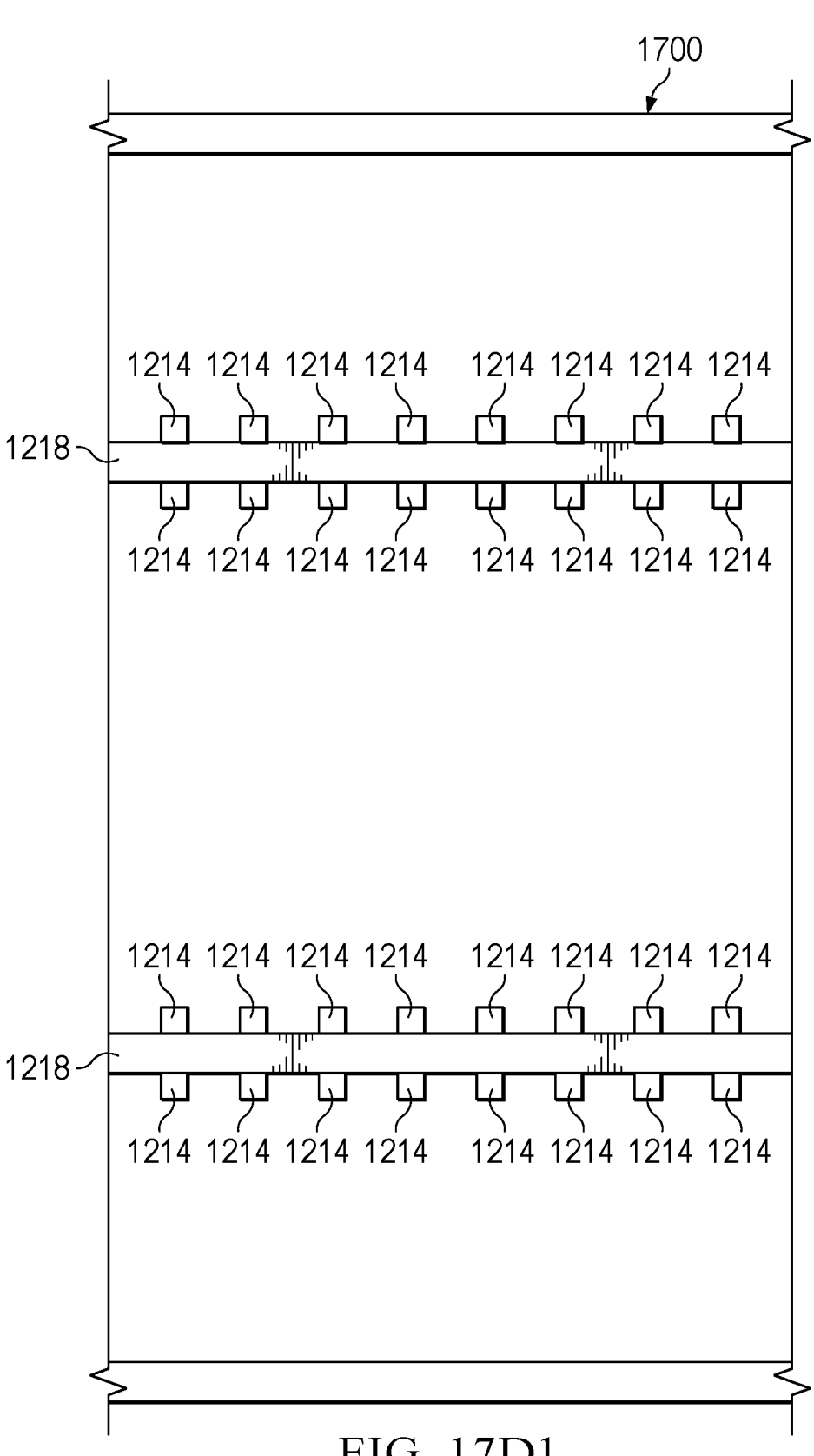
FIG. 17D1

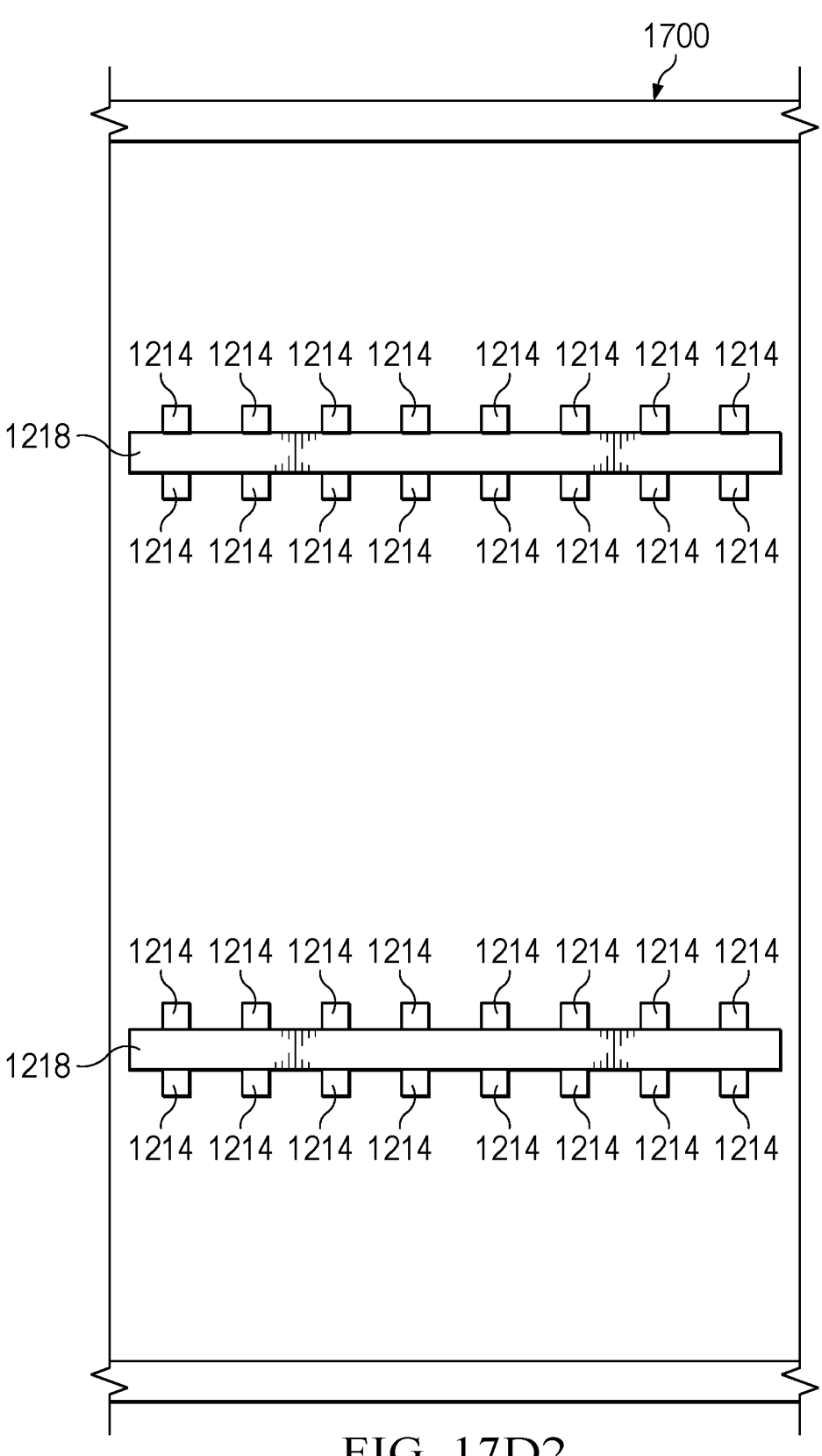
FIG. 17D2

1800

1804

1802

105

1801

1800

105

1804

1804

1804

1804

1804

1804

1804

1804

1801

1804

1804

1804

1804

1804

1804

1804

1804

2400

ELECTRONIC DEVICE  2402

PCB

SEMICONDUCTOR PACKAGE

2404

MOLDED PACKAGE WITH PRESS-FIT CONDUCTIVE PINS

BACKGROUND

Semiconductor chips are often housed inside semiconductor packages that protect the chips from deleterious environmental influences, such as heat, moisture, and debris. A packaged chip communicates with electronic devices outside the package via conductive terminals, such as leads, that are exposed to surfaces of the package. Within the package, the chip may be electrically coupled to the conductive terminals using any suitable technique. One such technique is the "flip-chip" technique, in which the semiconductor chip (also called a "die") is oriented so the device side of the chip (in which circuitry is formed) is facing downward. The device side is coupled to the conductive terminals using, e.g., solder bumps. Another technique is the wirebonding technique, in which the device side of the semiconductor chip is oriented upward and is coupled to the conductive terminals using bond wires. Wirebonds are formed on bond pads, which are positioned on semiconductor dies and provide interfaces between the wirebonds and circuitry of the semiconductor dies.

SUMMARY

In examples, a method of manufacturing a semiconductor package comprises providing a lead frame having multiple conductive pins coupled thereto; positioning the lead frame within a mold chase and applying a strip of mold compound to the multiple conductive pins along a length of the lead frame; trimming connections between the lead frame and the multiple conductive pins; bending the multiple conductive pins; trimming the strip of mold compound to singulate the multiple conductive pins from each other and from the lead frame to form singulated conductive pins; coupling a singulated conductive pin from among the singulated conductive pins to a substrate such that a portion of the strip of mold compound coupled to the singulated conductive pin is in contact with the substrate and such that a segment of the singulated conductive pin extends vertically in a plane that is orthogonal to the substrate; coupling a semiconductor die to the substrate; and covering the substrate, the semiconductor die, the portion of the strip of mold compound, and part of the singulated conductive pin with a second mold compound, such that a portion of the segment of the singulated conductive pin extends beyond a top surface of the second mold compound.

In examples, a semiconductor power package comprises a substrate; a semiconductor die coupled to the substrate; and a conductive socket soldered to the substrate and to a device side of the semiconductor die having circuitry formed therein, the conductive socket having a cavity formed therein. The package also comprises a mold compound covering the substrate, the semiconductor die, and the socket, and a conductive pin physically contacting an inner surface of the cavity. The conductive pin and the conductive socket are independent structures, the conductive pin extending vertically from the cavity and through the mold compound, the conductive pin extending a distance beyond a top surface of the mold compound, a first portion of the conductive pin having a cross-sectional diameter larger than a cross-sectional diameter of the cavity and larger than a cross-sectional diameter of a second portion of the conductive pin positioned inside the cavity.

BRIEF DESCRIPTION OF THE DRAWINGS

FIGS. 6A-6C are perspective, profile, and bottom-up views of a sharp-pointed conductive pin, in accordance with various examples.

FIGS. 8A-8C are profile cross-sectional, perspective, and close-up cross-sectional views of a PCB having an orifice suitable for coupling to vertical conductive pins of a semiconductor package, in accordance with various examples.

FIG. 9 is a flow diagram of a semiconductor package manufacturing process in accordance with various examples.

FIGS. 10A-10G are a process flow for a semiconductor package manufacturing process, in accordance with various examples.

FIGS. 15A-15C are profile cross-sectional, perspective, and close-up cross-sectional views of a PCB having an orifice suitable for coupling to vertical conductive pins of a semiconductor package, in accordance with various examples.

FIG. 16 is a flow diagram of a semiconductor package manufacturing process in accordance with various examples.

FIGS. 17A-17G are a process flow for a semiconductor package manufacturing process, in accordance with various examples.

DETAILED DESCRIPTION

Figure 1A:
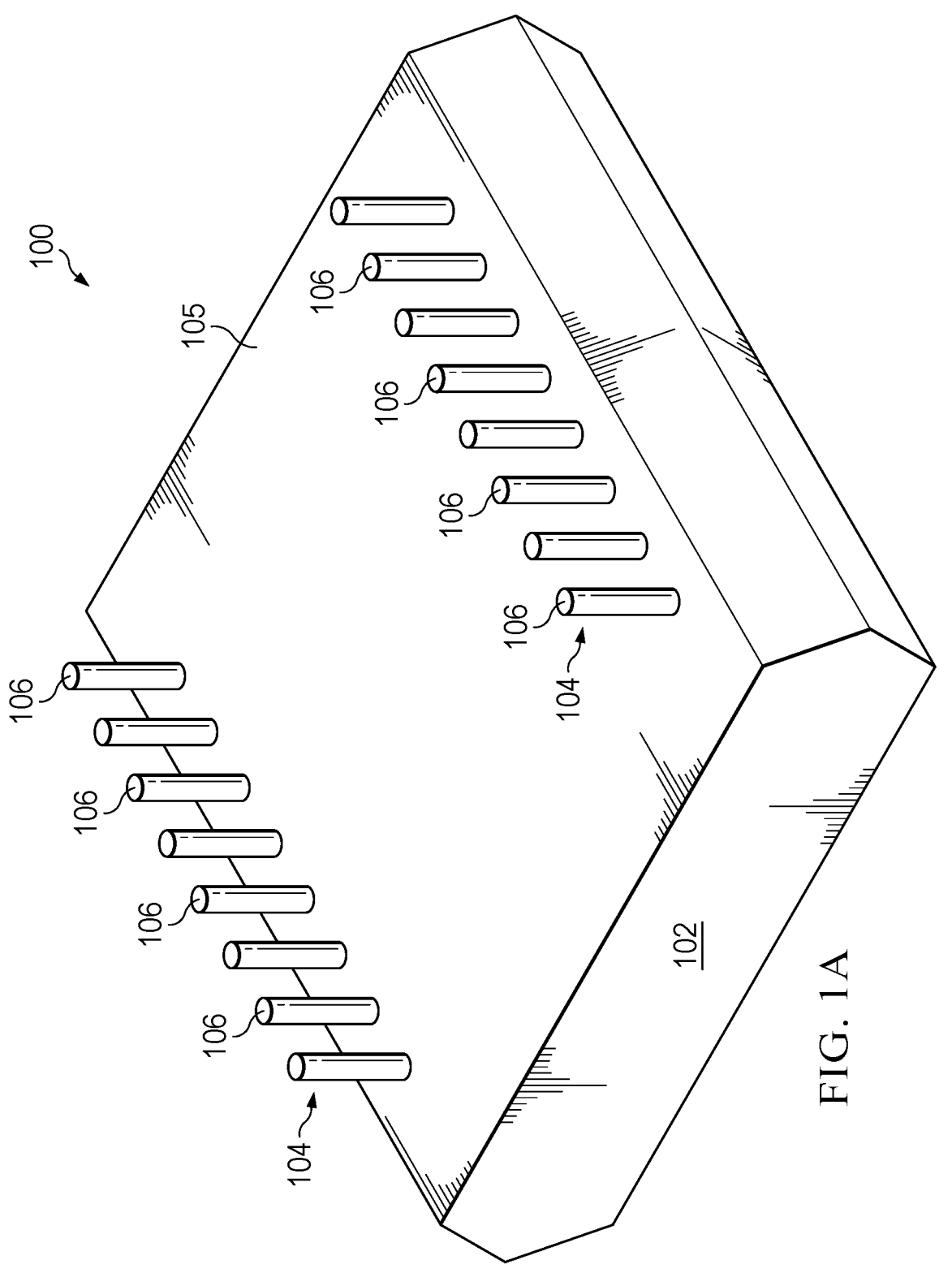
FIGS. 1A-1C are perspective, profile, and top-down views of a semiconductor package having multiple vertically-oriented conductive pins suitable for coupling to a printed circuit board (PCB), in accordance with various examples.

Semiconductor packages are useful to contain and protect power circuitry. Such semiconductor packages, called power packages, may be coupled to printed circuit boards (PCBs) in an electronic device, such as in consumer electronics, vehicles, appliances, etc. One type of power package is the through hole package (THP), which includes leads extending horizontally and downward from lateral sides of the package, with the downward-extending lead portions being used to couple the package to the PCB. The manufacture and coupling of such power packages to PCBs are expensive and tedious. For example, specialized tools and additional processes, such as wave soldering techniques, are used and represent significant additions to manufacturing expense and time.

Another type of power package is the case-type press-fit power package. Case-type press-fit power packages include conductive pins that extend vertically from a top surface of the package. The conductive pins are specifically shaped to facilitate easy and fast coupling of the package to a PCB. Specifically, a manufacturer may translate the package toward the PCB, and as the conductive pins enter PCB orifices adapted to receive the conductive pins, the conductive pins lock in place and prevent inadvertent removal of the package from the PCB. Although an improvement over THPs in some respects, these press-fit power packages are case-type packages and thus have a fundamentally different structure from traditional molded packages. The vertical conductive pins that are useful in press-fit power packages are not suitable for use in traditional molded packages. Further, press-fit power packages are complex, tedious, and expensive to manufacture.

Press-fit packages are also disadvantageous because the conductive pins have shapes that increase manufacturing costs. These conductive pins generally have substantial proportions in all three dimensions, meaning that in no dimension does the conductive pin have such a small measurement that the dimension can be considered negligible. To reduce costs, some conductive pins have been extensively thinned such that the thicknesses of the conductive pins can be considered negligible. However, such conductive pins couple poorly to PCBs, and these connections often fail.

Accordingly, this disclosure describes various examples of a molded package having conductive pins that facilitate easy and durable coupling to PCBs and that are inexpensive and relatively easy to manufacture. In some examples, a semiconductor power package includes a substrate, a semiconductor die coupled to the substrate, and a conductive socket coupled to the substrate and to a device side of the semiconductor die having circuitry formed therein. A conductive socket, as used herein, refers to a member positioned on a semiconductor package substrate and having a cavity configured to hold an elongate member using a press-fit, where the socket and the elongate member are independent structures. The power package also includes a mold compound covering the substrate, the semiconductor die, and the socket. The power package further includes a conductive pin extending vertically from an interior of the socket and through the mold compound. The conductive pin extends a distance beyond a top surface of the mold compound. The conductive pin has a cross-sectional diameter larger than an inner cross-sectional diameter of the socket. The inclusion of a conductive socket and a vertically-oriented conductive pin in the socket mitigates manufacturing complexities and costs at least because it is minimally complex and requires minimal manufacturing tooling and process modifications.

In other examples, a semiconductor power package includes a substrate, a semiconductor die coupled to the substrate, and a conductive pin having first and second segments. The first segment is coupled to the substrate and the second segment is in a vertical plane approximately orthogonal to the substrate. The power package also includes a first mold compound covering the substrate, the semiconductor die, the first segment, and a portion of the second segment, with the second segment terminating a distance beyond a top surface of the mold compound. The power package also comprises a second mold compound covering at least a portion of the first segment, with the first and second mold compounds having a difference in grain pattern. Such semiconductor power packages mitigate manufacturing complexities and costs at least because they are minimally complex and require minimal manufacturing tooling and process modifications.

In yet other examples, a semiconductor power package comprises a substrate, a semiconductor die coupled to the substrate, and a conductive pin extending vertically in a first plane approximately orthogonal to the substrate. The conductive pin includes a distal end having an anchor structure adapted to be coupled to a printed circuit board (PCB) through an orifice in the PCB. The anchor structure includes a first horizontal member having first and second ends, a second horizontal member having first and second ends, a first vertical member having first and second ends, and a second vertical member having first and second ends. The first end of the first horizontal member and the first end of the first vertical member intersect, the second end of the first horizontal member and the first end of the second vertical member intersect, the second end of the first vertical member and the first end of the second horizontal member intersect, and the second end of the second horizontal member and the second end of the second vertical member do not intersect. Such semiconductor power packages provide durable connections to PCBs because the second horizontal member anchors to the PCB, making the connection highly durable. Further, because the anchor structure is not geometrically complex, it is inexpensive and relatively easy to manufacture.

Figure 1B:
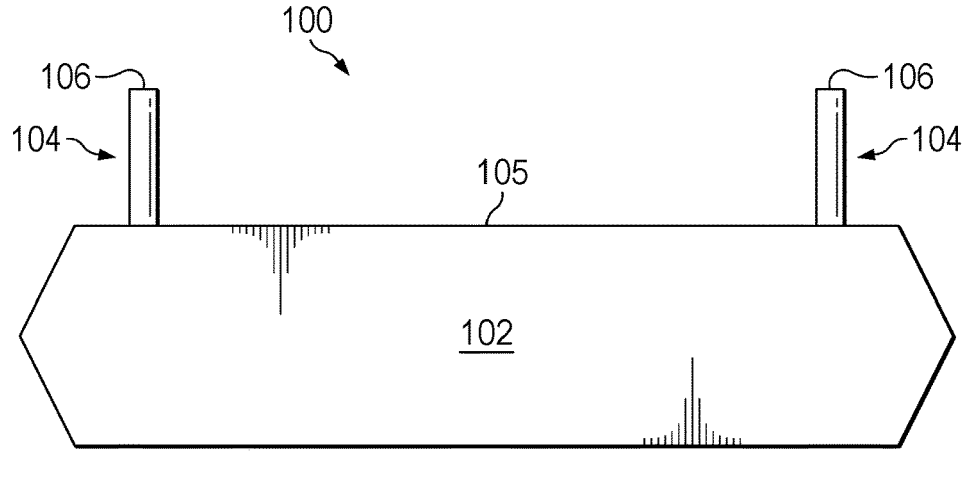
Figure 1C:
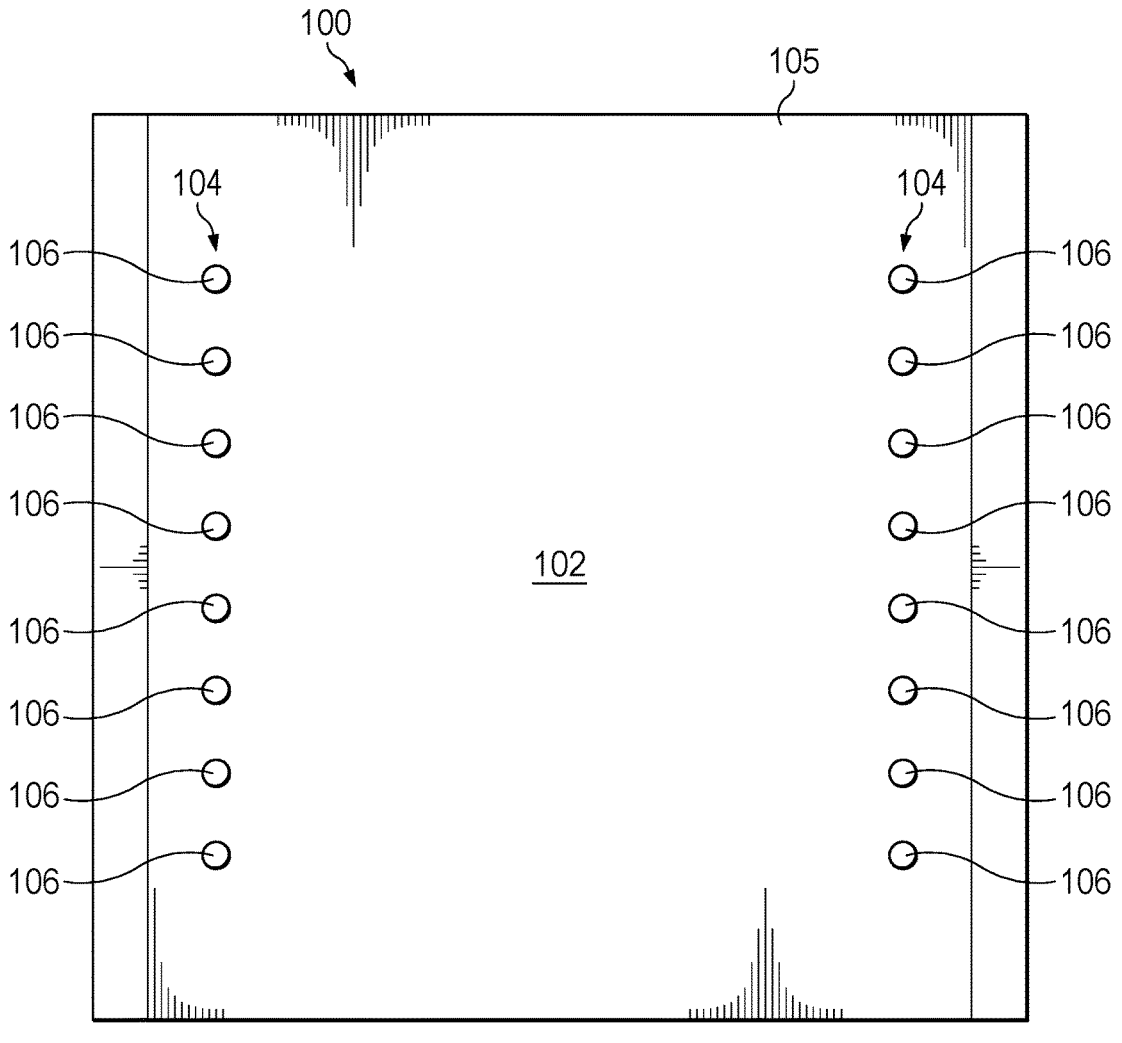

FIG. 1A is a perspective view of a semiconductor package 100, in accordance with various examples. The semiconductor package 100 may be included in any suitable electronic device, such as a laptop computer, a desktop computer, a tablet, a smartphone, an appliance (e.g., refrigerator), a vehicle (e.g., a ground vehicle, aircraft, or spacecraft), etc. In some examples, the semiconductor package 100 is a power package, meaning that the semiconductor package 100 is configured to supply power to one or more components of the electronic device in which the semiconductor package 100 is contained. In some examples, the semiconductor package 100 is coupled to a printed circuit board (PCB) that is positioned inside such an electronic device. The semiconductor package 100 may have any suitable shape and size. The semiconductor package 100 is a molded package, meaning that the semiconductor package 100 covers its contents using a mold compound. In the specific examples of FIG. 1, the semiconductor package 100 includes a mold compound 102 that covers contents (e.g., a semiconductor die) within the semiconductor package 100. Vertically-oriented conductive pins 104 extend from a top surface 105 of the semiconductor package 100. The conductive pins 104 have distal ends 106 suitable for coupling to a PCB, for example, by being press-fit into one or more orifices in the PCB. All press-fittings described herein include a member that is to be inserted into a cavity that is 5% to 20% narrower in diameter than the member for copper alloys, and 2%-30% narrower in diameter than the member for softer (e.g., aluminum) alloys. When the member is pressed into the cavity, the material of the member undergoes slight compression. This induces the member to exert a normal force onto the inner surface of the cavity. At the same time, the cavity presses inward, as it also goes through a slight expansion because of the insertion of the member. This normal force contributes to the generation of a large friction force which holds the two components together. FIG. 1B is a profile cross-sectional view of the structure of FIG. 1A. FIG. 1C is a top-down view of the structure of FIG. 1A.

Figure 2A:
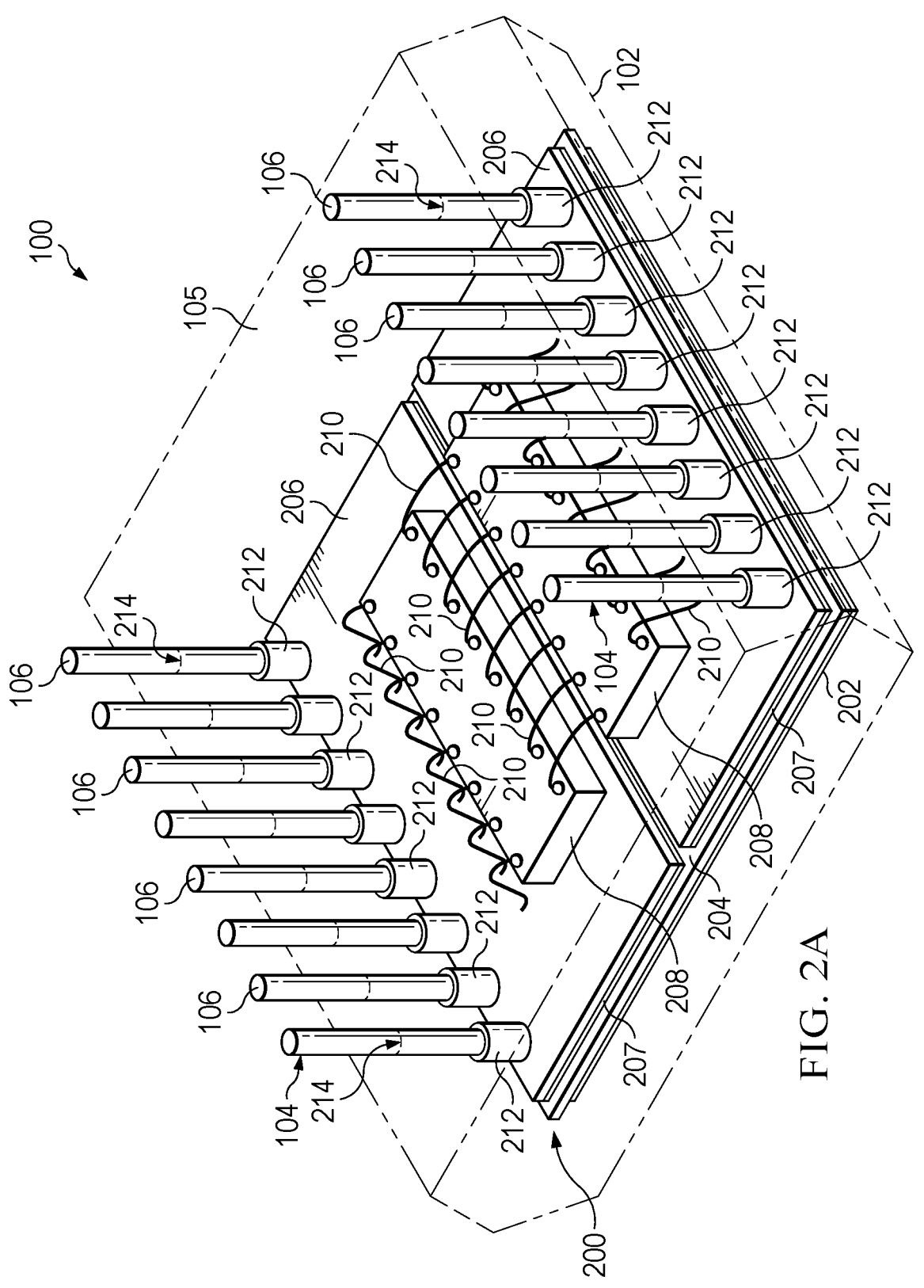
FIGS. 2A-2C are perspective, profile cross-sectional, and top-down views of an interior of a semiconductor package having multiple vertically-oriented conductive pins suitable for coupling to a PCB, in accordance with various examples.

FIG. 2A is a perspective view of an interior of the semiconductor package 100, in accordance with various examples. The mold compound 102 covers a substrate 200, which in some examples includes copper layers 202, 206 and a ceramic layer 204 positioned between the copper layers 202, 206. Although this description assumes the use of copper in the copper layers 202, 206, in some examples, other conductive metals or metal alloys may be used in lieu of copper. In some examples, the ceramic layer 204 couples to one or more of the copper layers 202, 206 by way of aluminum (or aluminum-based) layer 207. In some examples, the package 100 includes multiple copper layers 206 separated from each other by a gap, with a separate semiconductor die 208 positioned on each of the copper layers 206. The semiconductor dies 208 may be coupled to the copper layers 206 and/or to each other by way of bond wires 210. Other configurations for the bond wires 210 are contemplated and included in the scope of this disclosure. Other coupling techniques, such as solder bumps, also may be used, for example in instances where a device side of the semiconductor die(s) 208 faces the substrate 200.

Figures 2B, 2C:
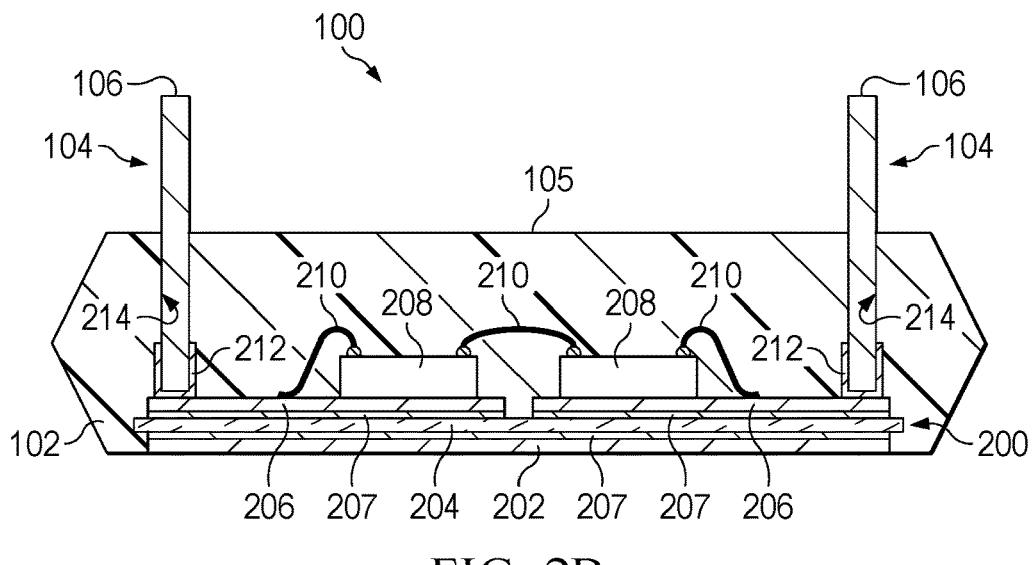

The mold compound 102 may cover a conductive socket 212 that is soldered, or otherwise coupled, to the copper layers 206. The semiconductor package 100 may include any number of conductive sockets 212. In some examples, each conductive socket 212 includes a cavity in which a corresponding conductive pin 104 is positioned. The diameter of the conductive socket 212 may be smaller than that of the conductive pin 104 positioned therein, thereby facilitating a press-fit coupling between the conductive socket 212 and the conductive pin 104. The mold compound 102 may include cavities 214 in which the conductive pins 104 are positioned. Thus, the conductive pins 104 may be positioned inside the conductive sockets 212 and may extend vertically through the cavities 214 and beyond the top surface 105 of the semiconductor package 100. The degree to which the conductive pins 104 extend beyond the top surface 105 (i.e., the distance between the distal ends 106 and the top surface 105) may vary depending on the size of the electronic device in which the semiconductor package 100 is positioned, the clearance desired between the semiconductor package 100 and the PCB to which the semiconductor package 100 is coupled, etc. FIG. 2B is a profile cross-sectional view of the structure of FIG. 2A. FIG. 2C is a top-down, see-through view of the structure of FIG. 2A.

Figure 3A:
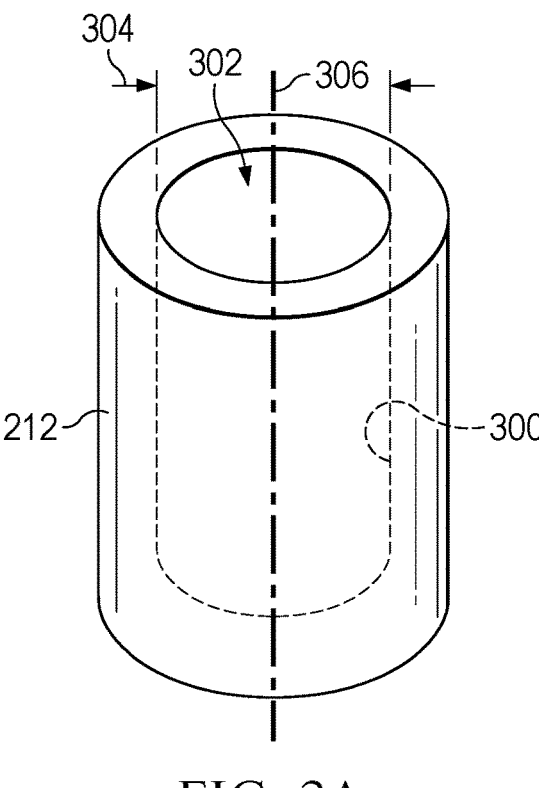
FIGS. 3A-3C are perspective, profile cross-sectional, and top-down views of a conductive socket, in accordance with various examples.
Figure 3B:
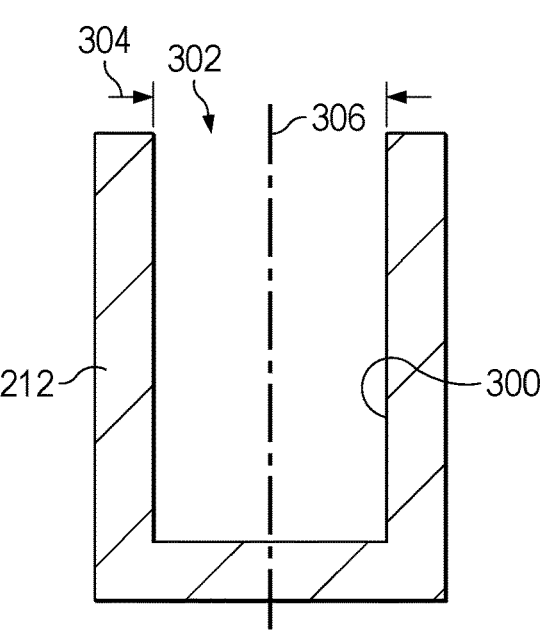
Figure 3C:
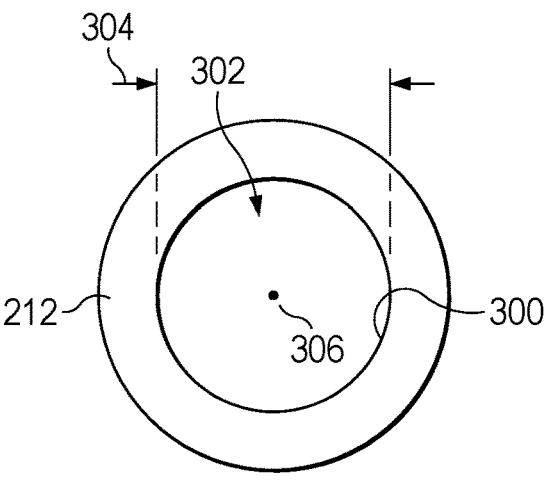

FIG. 3A is a perspective view of a conductive socket 212, in accordance with various examples. FIGS. 3B and 3C are profile cross-sectional and top-down views of the conductive socket 212, respectively. In some examples, the conductive socket 212 has a circular horizontal cross-section such that a cavity 302 of the conductive socket 212 has a cylindrical volume. The conductive socket 212 may be composed of any suitable metal or metal alloy, such as copper, gold, or aluminum. The conductive socket 212 has an inner diameter 304 (measured from inner wall 300 to inner wall 300 and passing through a central, longitudinal axis 306 of the cavity 302) that is smaller than a horizontal cross-sectional diameter of a conductive pin inserted into the conductive socket 212. Thus, the conductive pin 104 is said to be press-fit into the conductive socket 212. The inner diameter 304 is 80% to 95% of the horizontal cross-sectional diameter of the conductive pin 104 that is press-fit into the conductive socket 212. An inner diameter 304 that is smaller than this range precludes insertion of the conductive pin 104 inside the conductive socket 212. Conversely, an inner diameter 304 that is larger than this range will not securely couple to the conductive pin 104, resulting in excessive play or loss of the conductive pin 104. The depth of the cavity 302 is 1 millimeter (mm) to 3 mm. A cavity 302 deeper than this range will not permit adequate exposure of the conductive pin 104 for coupling to a PCB, or will not permit adequate clearance between the top surface 105 of the semiconductor package 100 and the PCB. Conversely, a cavity 302 shallower than this range will not securely couple to the conductive pin 104, resulting in damage to the conductive pin 104 or loss of the conductive pin 104. The horizontal, cross-sectional shape of the cavity 302 matches that of the horizontal cross-section of the conductive pin 104, with differing shapes providing a weaker connection and with identical shapes providing a stronger connection.

Figures 4A, 4B, 4C:
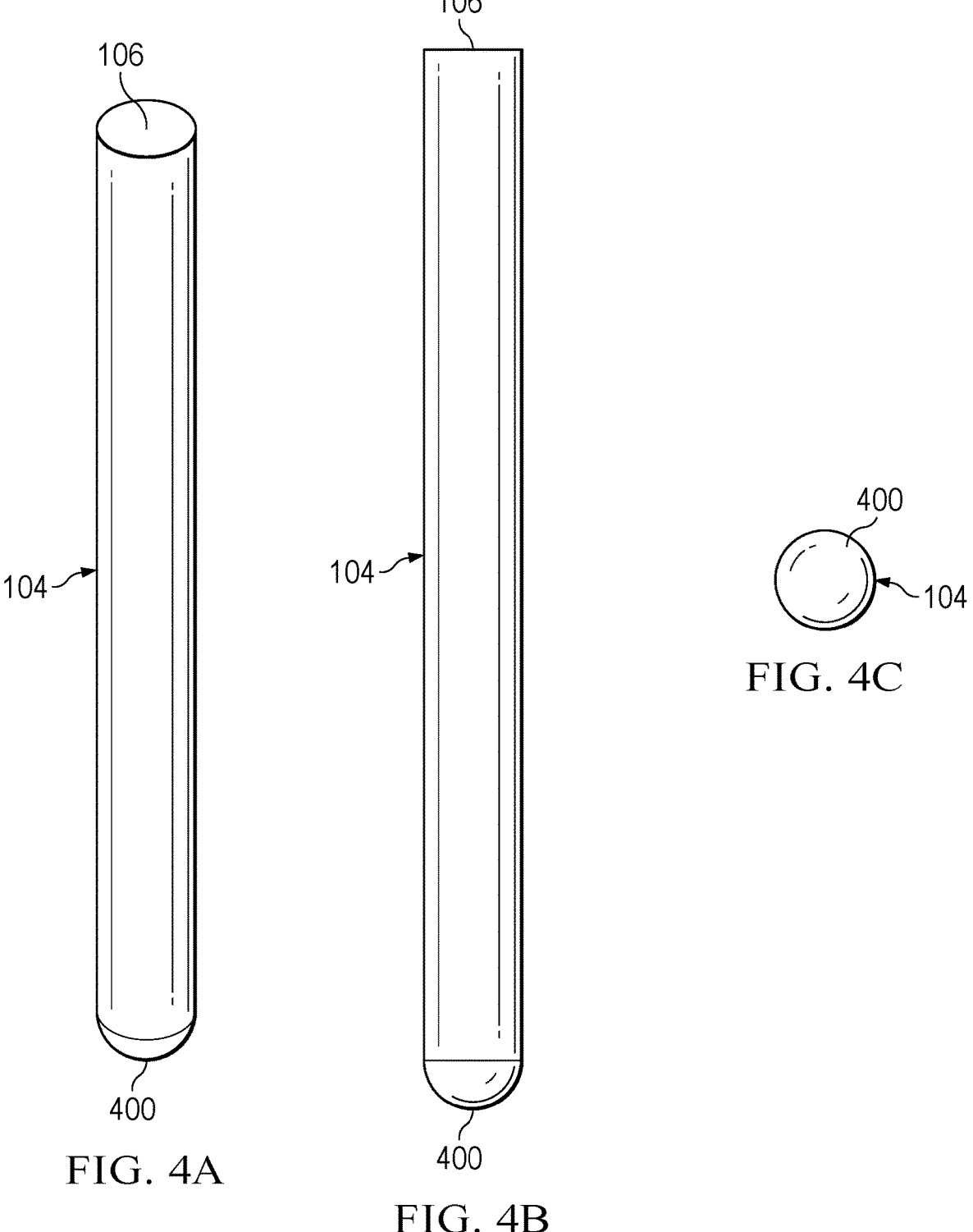
FIGS. 4A-4C are perspective, profile, and bottom-up views of a full bullnose conductive pin, in accordance with various examples.

FIGS. 4A-4C are perspective, profile, and bottom-up views of a full bullnose conductive pin 104, in accordance with various examples. Specifically, the conductive pin 104 includes an end 400 and an end 106. The end 400 is a full bullnose end, and the end 106 is flat. The end 400 is inserted into the conductive socket 212, with the bullnose shape facilitating insertion and requiring less precision during coupling than would otherwise be required with a flat end. Because the end 400 is inserted into the conductive socket 212, the end 400 is referred to as a proximal end and the end 106 is referred to as a distal end. The horizontal cross-sectional diameter of the conductive pin 104 is larger than the inner diameter 304 of the conductive socket 212 by a range from 5% to 20% at least those reasons provided above. The portion of the conductive pin 104 that is positioned within the conductive socket 212 has a smaller cross-sectional diameter than the portion of the conductive pin 104 that is positioned outside the conductive socket 212 because the conductive pin 104 is press-fit into the conductive socket 212. A similar structural description applies to other conductive pins described herein that are press-fit into conductive sockets. The length of the conductive pin 104 exceeds the depth of the cavity 302 of the conductive socket 212 by 1mm to 3 mm for at least the reasons provided above.

Figures 5A, 5B, 5C:
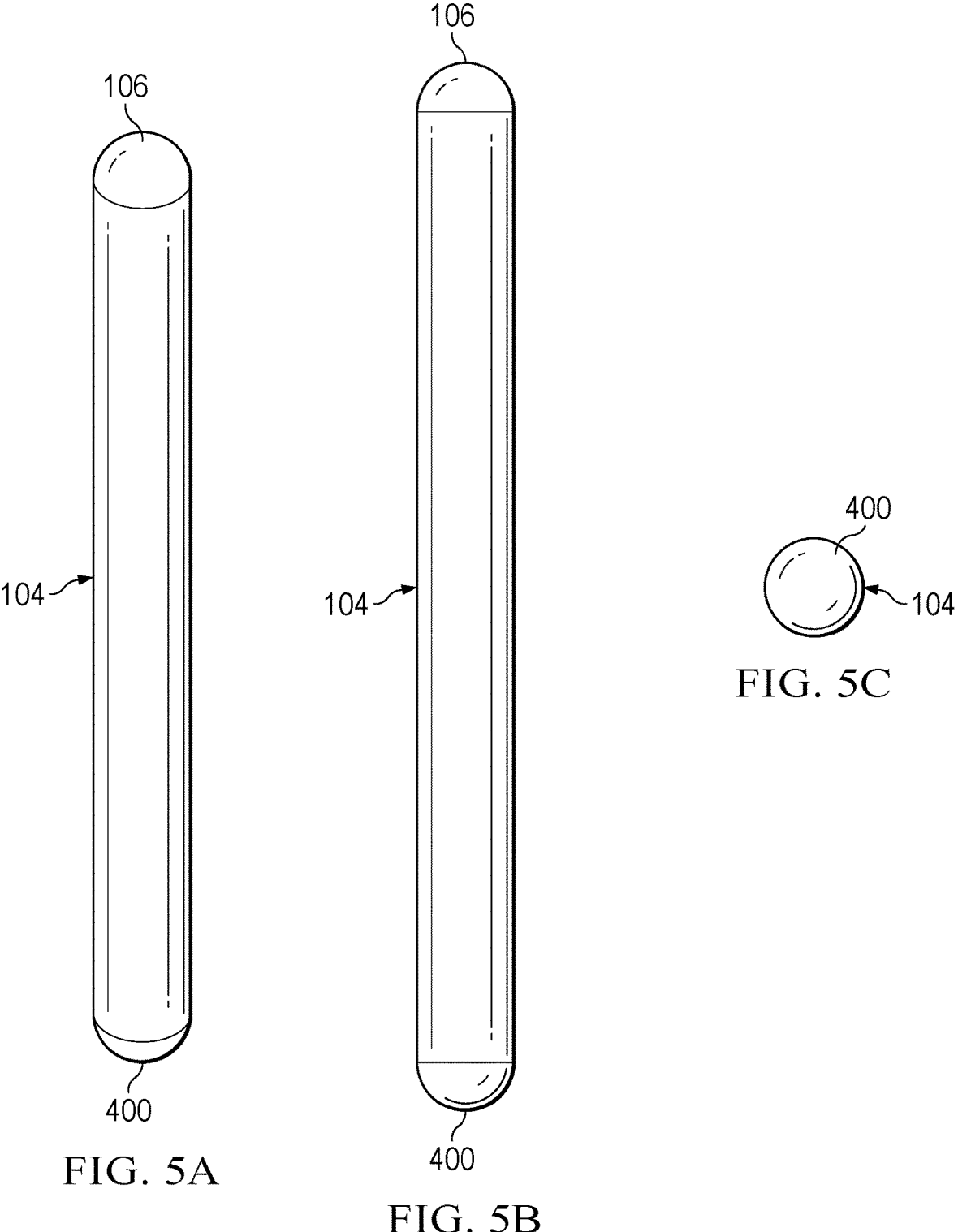
FIGS. 5A-5C are perspective, profile, and bottom-up views of a double bullnose conductive pin, in accordance with various examples.

FIGS. 5A-5C are perspective, profile, and bottom-up views of a double bullnose conductive pin 104, in accordance with various examples. The double bullnose conductive pin 104 of FIGS. 5A-5C differs from the full bullnose conductive pin 104 of FIGS. 4A-4C because both ends 400 and 106 have full bullnose shapes to facilitate insertion into the conductive socket 212 and an orifice in a PCB. The dimensions of the double bullnose conductive pin 104 are the same as those of the full bullnose conductive pin 104 and thus are not repeated here.

FIGS. 6A-6C are perspective, profile, and bottom-up views of a sharp-pointed conductive pin 104, in accordance with various examples. The sharp-pointed conductive pin 104 has a pointed end 400 and a pointed end 106. In some examples, only a single end 400, 106 is pointed. A pointed end differs from a bullnose end by to surface area of the tip of the end. A bullnose end, such as a full bullnose end, will have a rounded tip with a larger surface area, while a pointed end will have a sharper tip with a smaller surface area. The pointed end, like the bullnose end, facilitates insertion into the conductive socket 212 and orifices in a PCB.

Figures 7A, 7B, 7C:
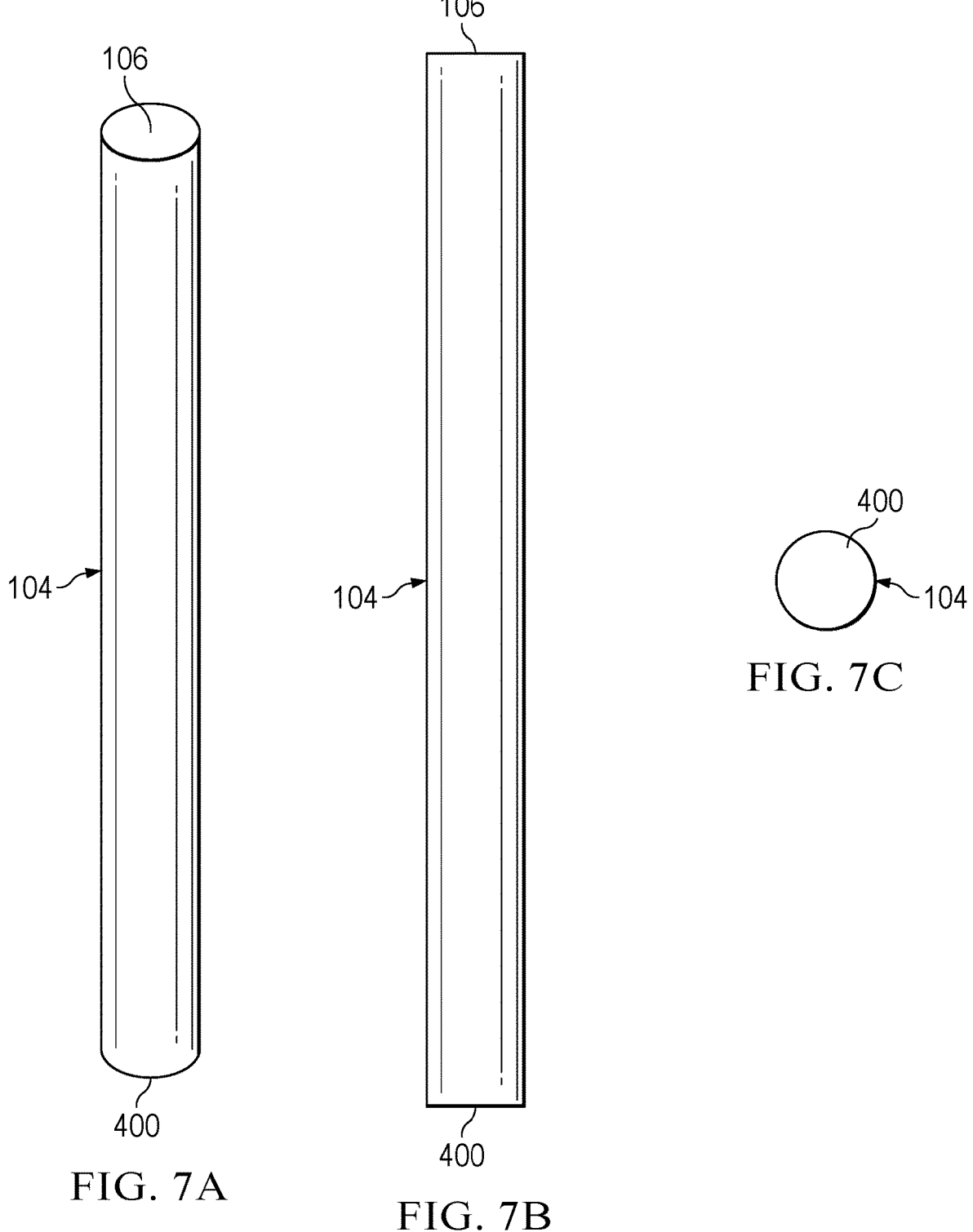
FIGS. 7A-7C are perspective, profile, and bottom-up views of a cylindrical conductive pin, in accordance with various examples.

FIGS. 7A-7C are perspective, profile, and bottom-up views of a cylindrical conductive pin 104, in accordance with various examples. The conductive pin 104 has ends 400, 106 that are flat, meaning that the ends 400, 106 are parallel to each other. Shapes of the conductive pin 104 other than those expressly depicted and described in this disclosure are contemplated and included in the scope of this disclosure.

Figure 8A:
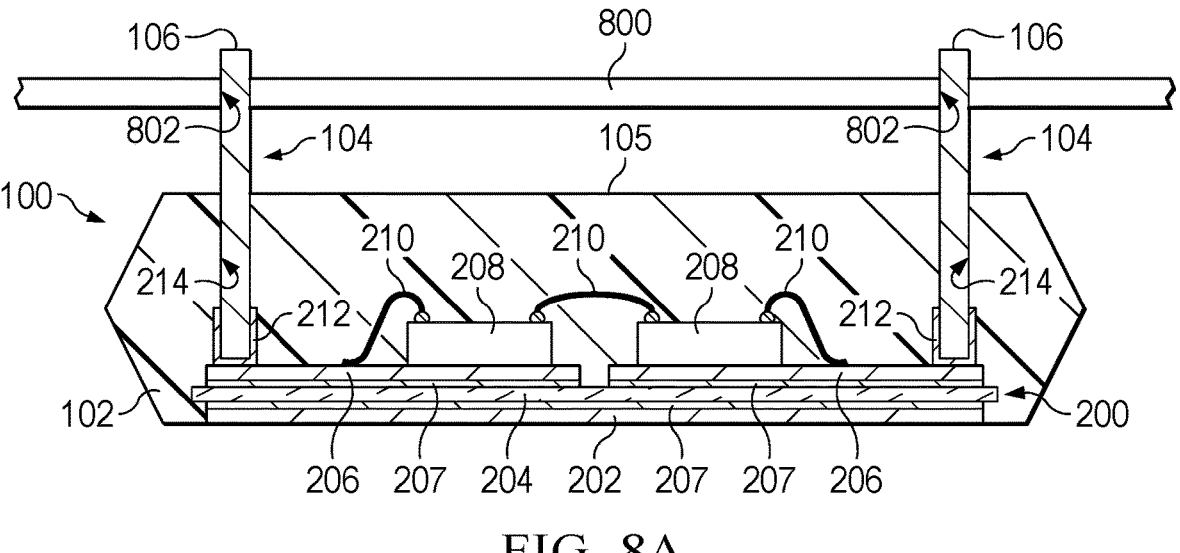
Figure 8B:
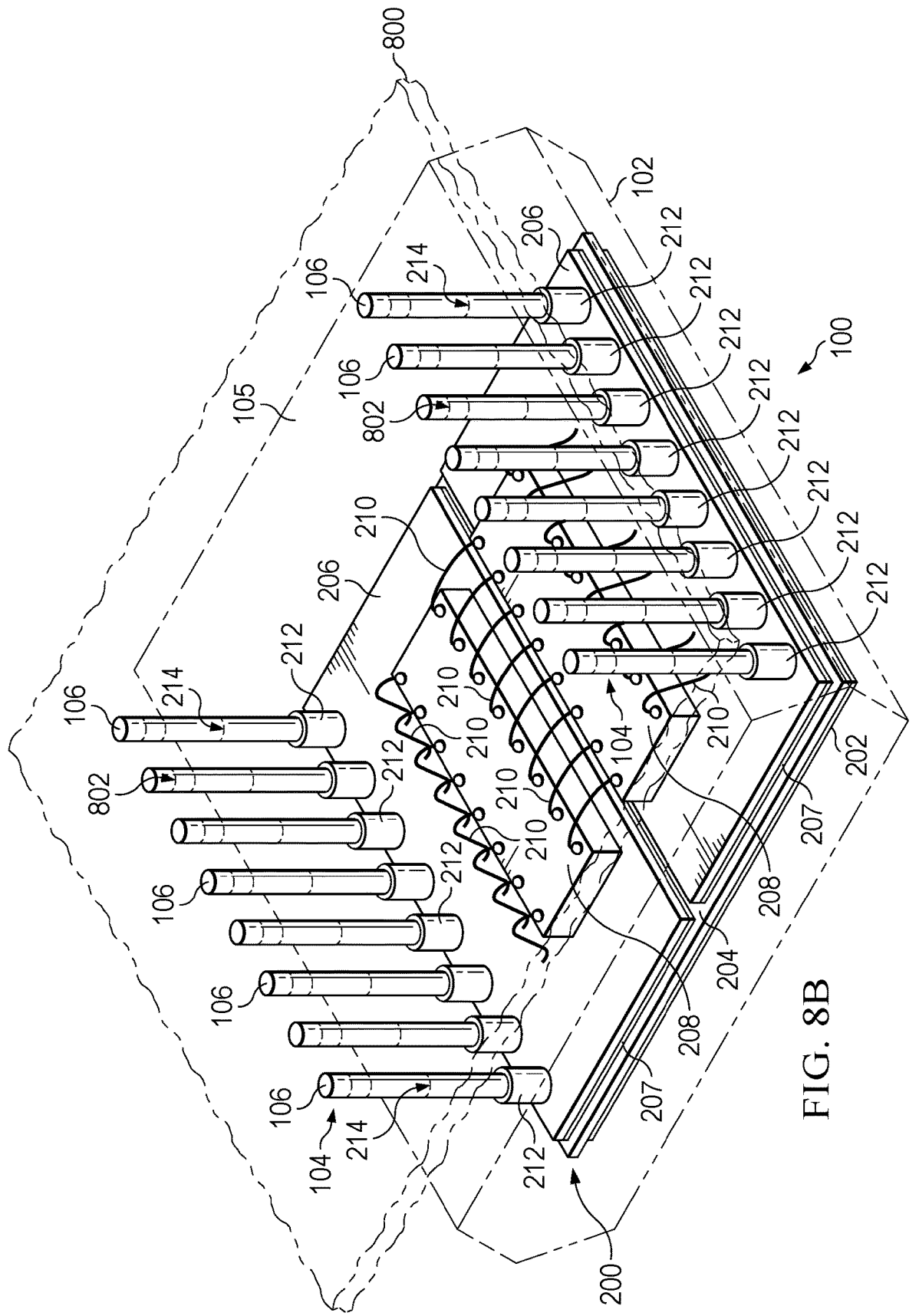

FIGS. 8A-8C are profile cross-sectional, perspective, and close-up cross-sectional views of a PCB having an orifice suitable for coupling to vertical conductive pins of a semiconductor package, in accordance with various examples. Specifically, FIG. 8A depicts a PCB 800 having orifices 802. A semiconductor package 100 is coupled to the PCB 800 by way of conductive pins 104. The conductive pins 104 are press-fit into the orifices 802 of the PCB 800. To facilitate such press-fitting, the diameters of the orifices 802 are smaller than the horizontal cross-sectional diameters of the conductive pins 104. In FIG. 8C, numeral 804 depicts the diameter of the orifice 802. The diameter 804 ranges from 80% to 95% of the horizontal cross-sectional diameter of the conductive pin 104 that is press-fit into the orifice 802.

FIG. 9 is a flow diagram of a semiconductor package manufacturing method 900 in accordance with various examples. FIGS. 10A-10G are a process flow for a semiconductor package manufacturing process, in accordance with various examples. Accordingly, FIGS. 9 and 10A-10G are now described in parallel.

Figure 10D:
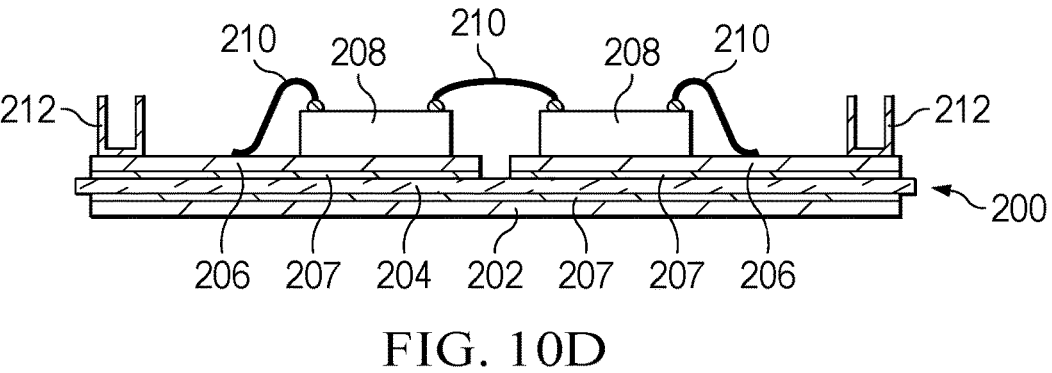
Figure 10E:
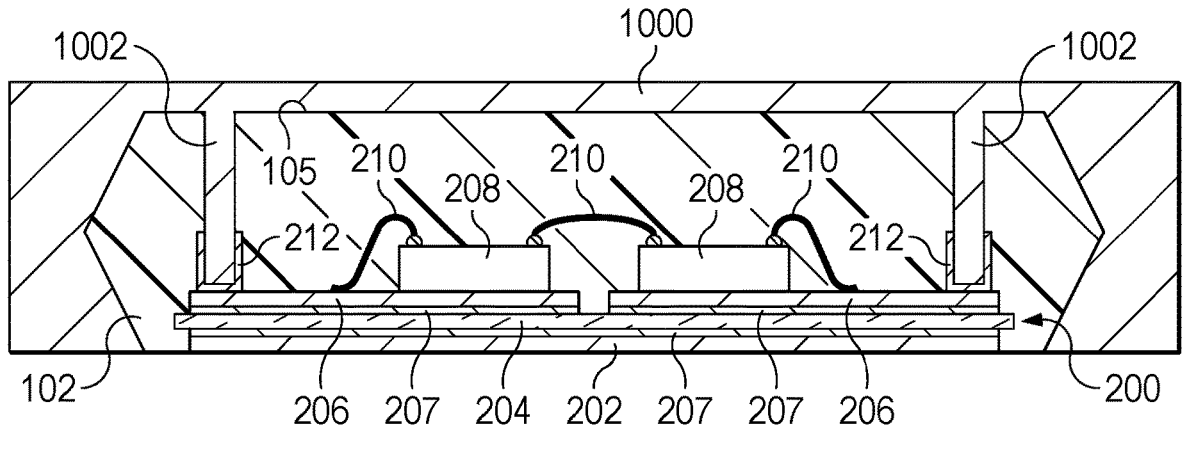

The method 900 begins by providing a substrate having ceramic, aluminum, and copper layers (902). FIG. 10A is a profile cross-sectional view of such a substrate 200 having a ceramic layer 204, copper layers 202, 206, and aluminum layers 207 positioned between the ceramic layer 204 and the copper layers 202, 206. The method 900 includes coupling a semiconductor die to the copper layer using a die attach material (904). FIG. 10B depicts the structure of FIG. 10A, with the addition of semiconductor dies 208. The method 900 includes wirebonding the device side of the semiconductor die to the copper layer (906). FIG. 10C depicts the structure of FIG. 10B, with the addition of bond wires 210 coupling the device side of the semiconductor die to the copper layers 206. The method 900 includes soldering conductive sockets to the copper layer (908). FIG. 10D depicts the soldering of conductive sockets 212 to the copper layers 206. The method 900 includes positioning the assembly in a mold chase with cylindrical members of the mold chase vertically aligned with the conductive socket (910). FIG. 10E depicts the structure of FIG. 10D positioned inside a mold chase 1000. The mold chase 1000 includes cylindrical members 1002 that are vertically aligned with the conductive sockets 212, thereby preventing injected mold compound from flowing into the conductive sockets 212 and preventing injected mold compound from flowing into the volume occupied by the cylindrical members 1002, thereby preserving empty space for subsequent insertion of the conductive pins. The diameter of each cylindrical member 1002 is the same as the inner diameter of a corresponding conductive socket. If the diameter of the cylindrical member 1002 is too narrow, a conductive pin won't fit in the cavity being formed by the cylindrical member 1002; and if the diameter of the cylindrical member 1002 is too wide, there will be excessive play within the cavity and the pin will not be adequately mechanically supported, resulting in an unacceptably unstable mechanical connection.

Figure 10F:
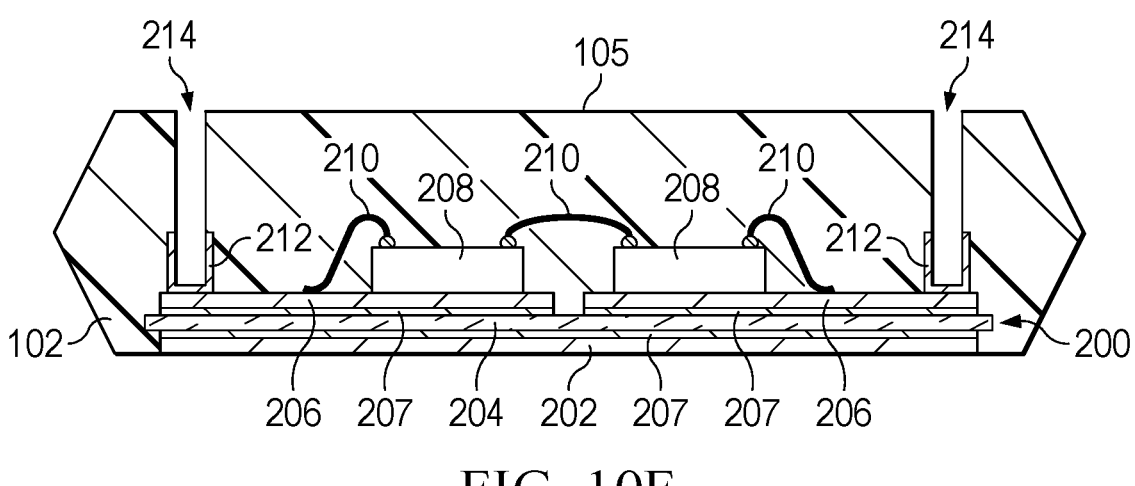
Figure 10G:
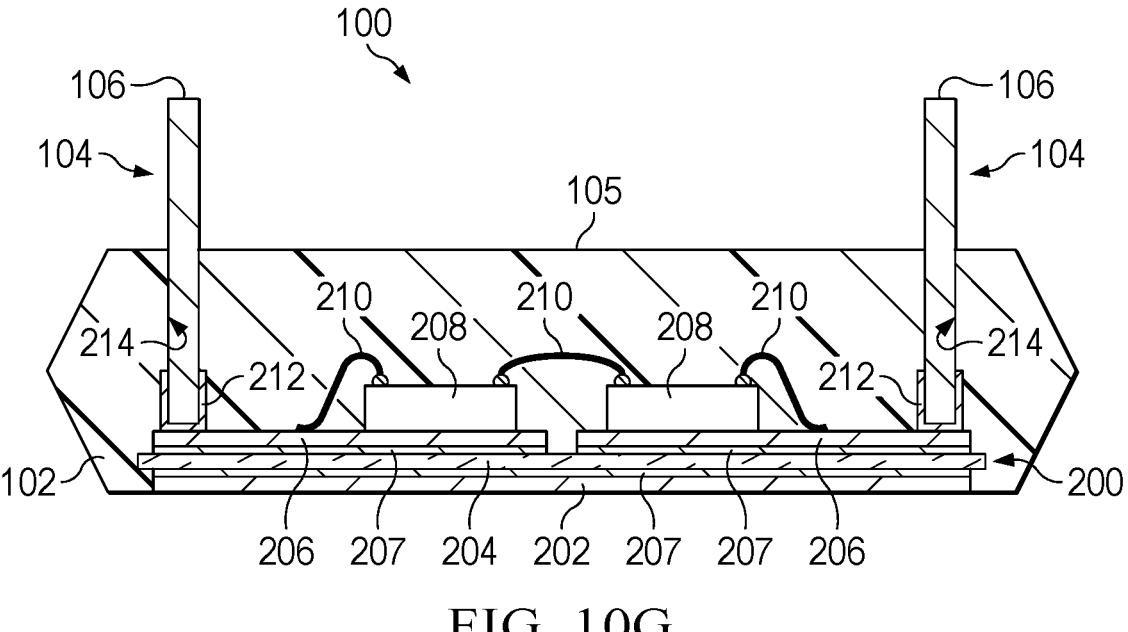
Figure 11A:
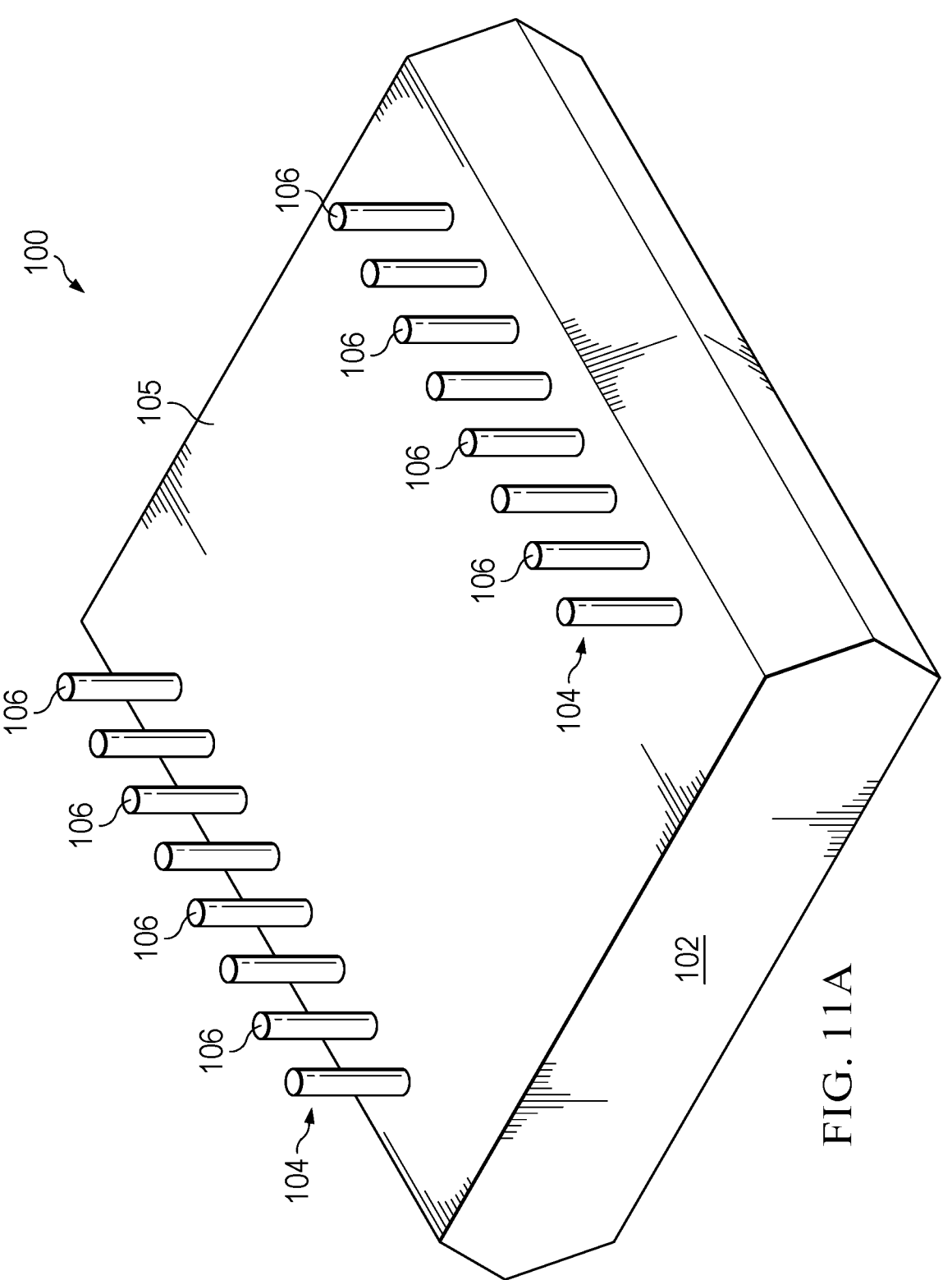
FIGS. 11A-11C are perspective, profile, and top-down views of a semiconductor package having multiple vertically-oriented conductive pins suitable for coupling to a printed circuit board (PCB), in accordance with various examples.
Figure 11B:
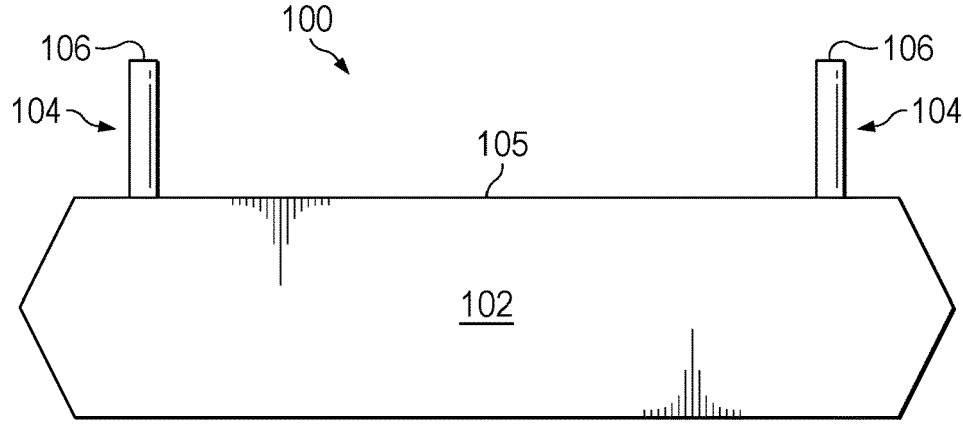
Figure 11C:
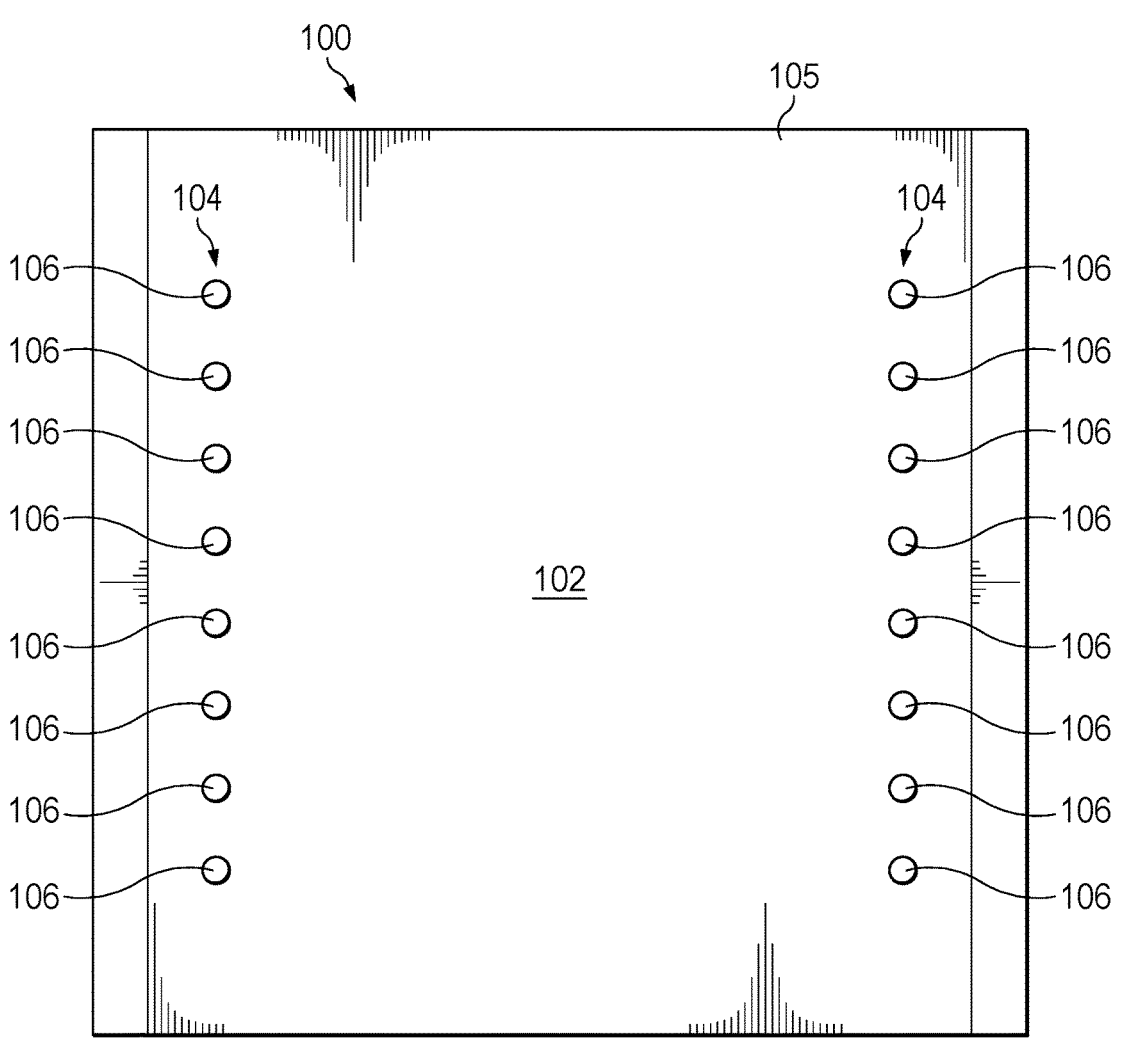

The method 900 includes applying (e.g., injecting) and curing mold compound (912), as shown in FIG. 10F with the removal of the assembly from the mold chase 1000. Curing of the mold compound results in the formation of the cavities 214 above and in vertical alignment with the conductive sockets 212, thereby preserving space for the insertion of conductive pins. The method 900 includes inserting a conductive pin inside the mold compound cavity and conductive socket (914). FIG. 10G shows the insertion of the conductive pins 104 in the cavities 214 and the conductive sockets 212. FIGS. 11A-11C are perspective, profile, and top-down views of the semiconductor package 100 having been formed by the method 900, in accordance with various examples.

The various examples described above include conductive sockets 212. In some examples, conductive pins are coupled to each other by a mold compound strip and are bent to have first and second segments, the first segment coupled to a copper layer of the substrate and the second segment extending vertically, away from the substrate. The second segment is adapted to be coupled (e.g., press-fit) to orifices in a PCB. The mold compound strip maintains the relative alignment of the conductive pins with each other, including after coupling to the copper layer on the substrate, so that the alignment is not disturbed and thus the conductive pins remain compatible with tooling used during the manufacturing process (e.g., the conductive pins maintain alignment such that they can be simultaneously inserted into a mold chase during mold compound injection). Such semiconductor power packages mitigate manufacturing complexities and costs at least because they are minimally complex and require minimal manufacturing tooling and process modifications.

Figure 12A:
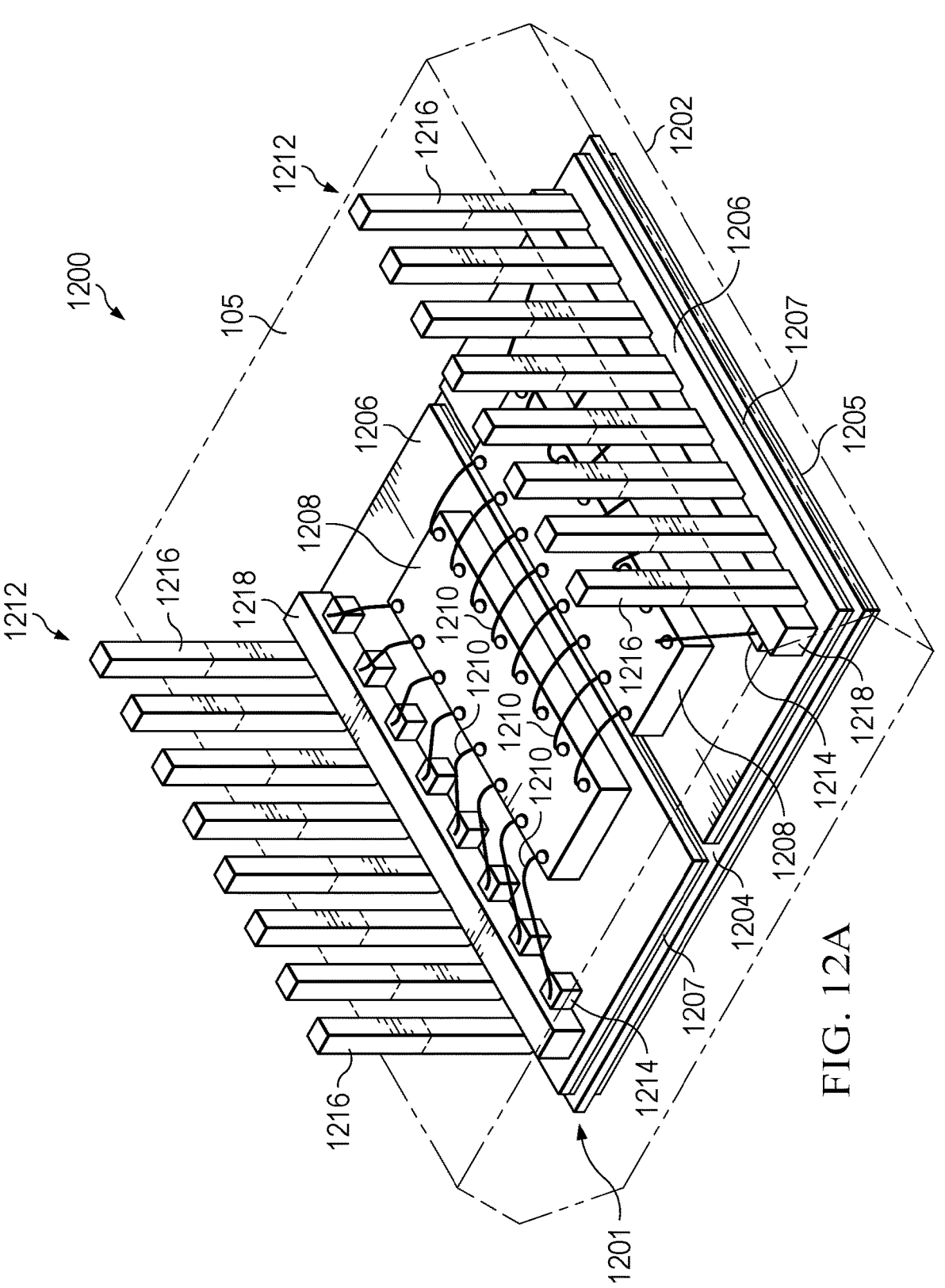
FIGS. 12A-12C are perspective, profile cross-sectional, and top-down views of an interior of a semiconductor package having multiple vertically-oriented conductive pins suitable for coupling to a PCB, in accordance with various examples.
Figures 12B, 12C:
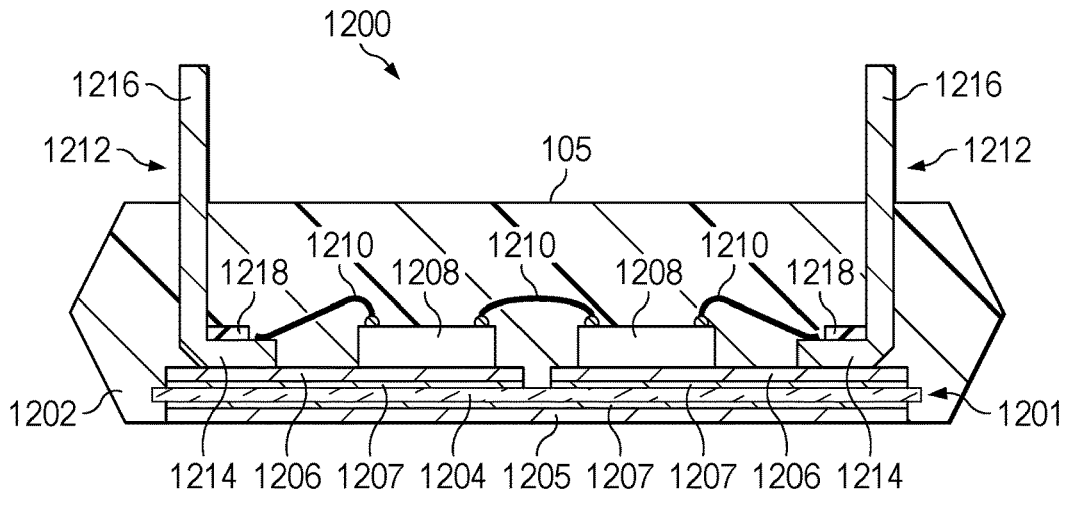

Accordingly, FIGS. 12A-12C are perspective, profile cross-sectional, and top-down views, respectively, of an interior of a semiconductor package 1200 having multiple vertically-oriented conductive pins suitable for coupling to a PCB, in accordance with various examples. The semiconductor package 1200 includes a mold compound 1202. The mold compound 1202 covers a substrate 1201 that includes a ceramic layer 1204 and metal layers 1205, 1206. In examples, the ceramic layer 1204 and the metal layers 1205, 1206 are coupled by an aluminum (or aluminum-based alloy) layer 1207. The mold compound 1202 also covers semiconductor dies 1208, which may be coupled to the metal layers 1206 and/or to each other by bond wires 1210. Conductive pins 1212 includes first segments 1214 and second segments 1216. The first segments 1214 are coupled (e.g., soldered) to the metal layers 1206. In examples, the first one or more of the segments 1214 is coupled to one or more of the bond wires 1210. The second segments 1216 extend vertically, away from the substrate 1201, through a top surface of the mold compound 1202. The second segments 1216 extend beyond the top surface of the mold compound 1202 by a length ranging from 2 mm to 7 mm, with a smaller length being disadvantageous because of a reduced coupling strength with a PCB, and with a greater length being disadvantageous because it will interfere with other components adjacent to the PCB. Mold compound strips 1218 couple the first segments 1214 to the metal layers 1206 and to each other. The mold compound strips 1218 are useful to maintain the alignment of the conductive pins 1212 relative to each other as that alignment exists on the lead frame from which the conductive pins 1212 are obtained. By maintaining such alignment, the second segments 1216 may, for example, be inserted into orifices of a mold chase or other tooling equipment during manufacture. Conductive pins 1212 not coupled to each other by such a mold compound strip 1218 may fail to maintain their alignment and thus disturb the compatibility of the conductive pins 1212 with various tooling equipment.

Figure 13A:
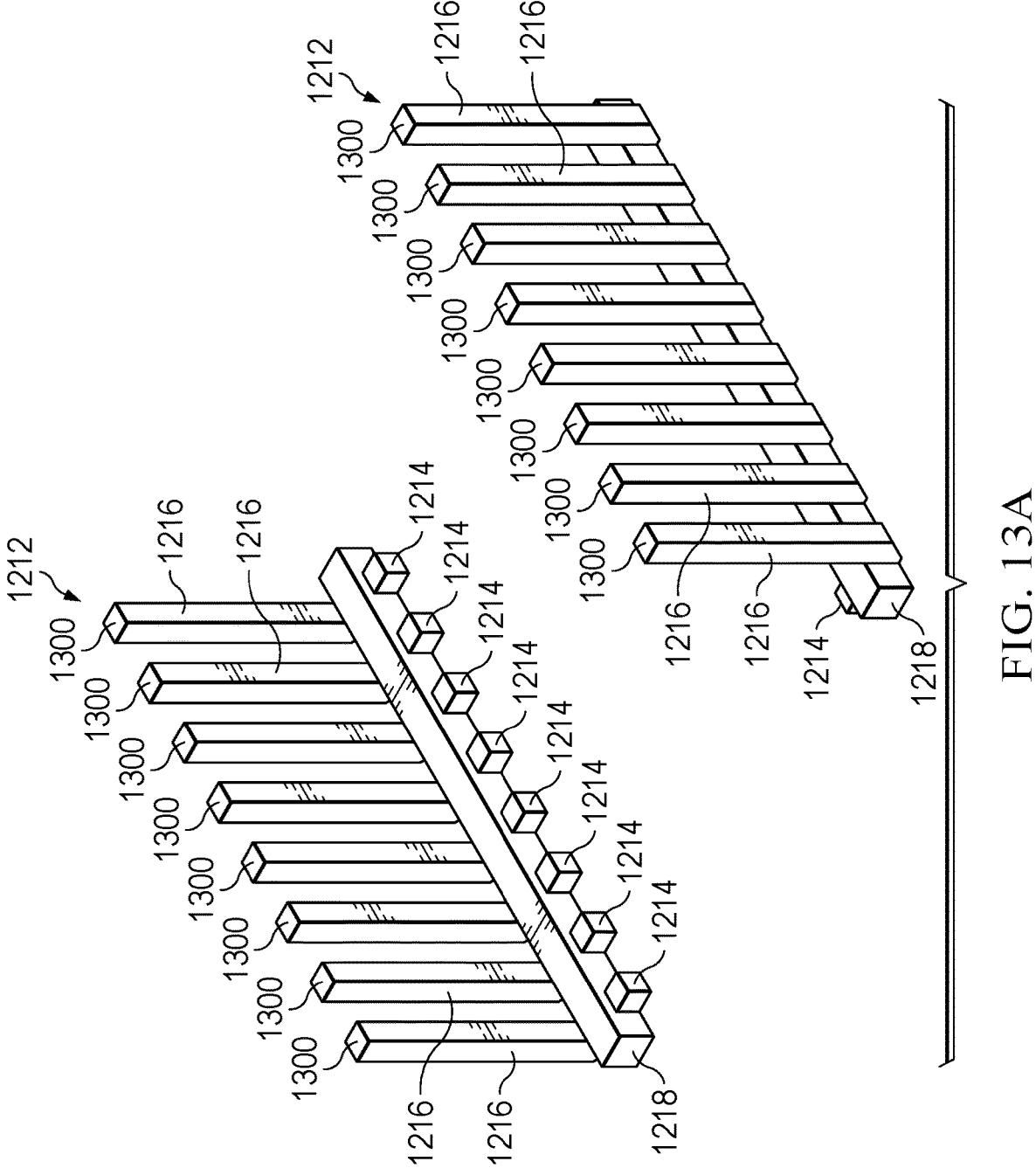
FIGS. 13A-13C are perspective, profile cross-sectional, and top-down views of an array of conductive pins and a portion of a mold compound strip coupled thereto, in accordance with various examples.
Figure 13B:
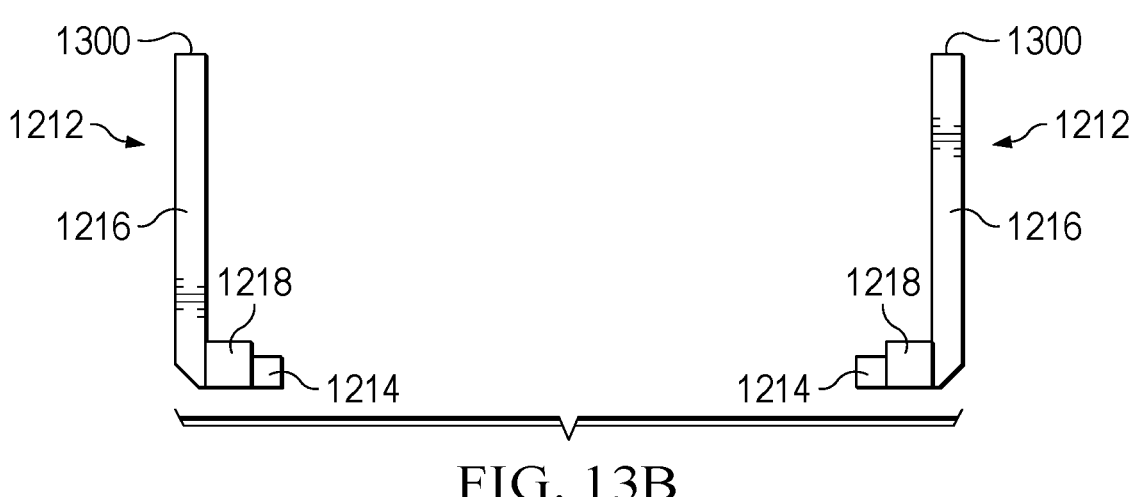
Figure 13C:
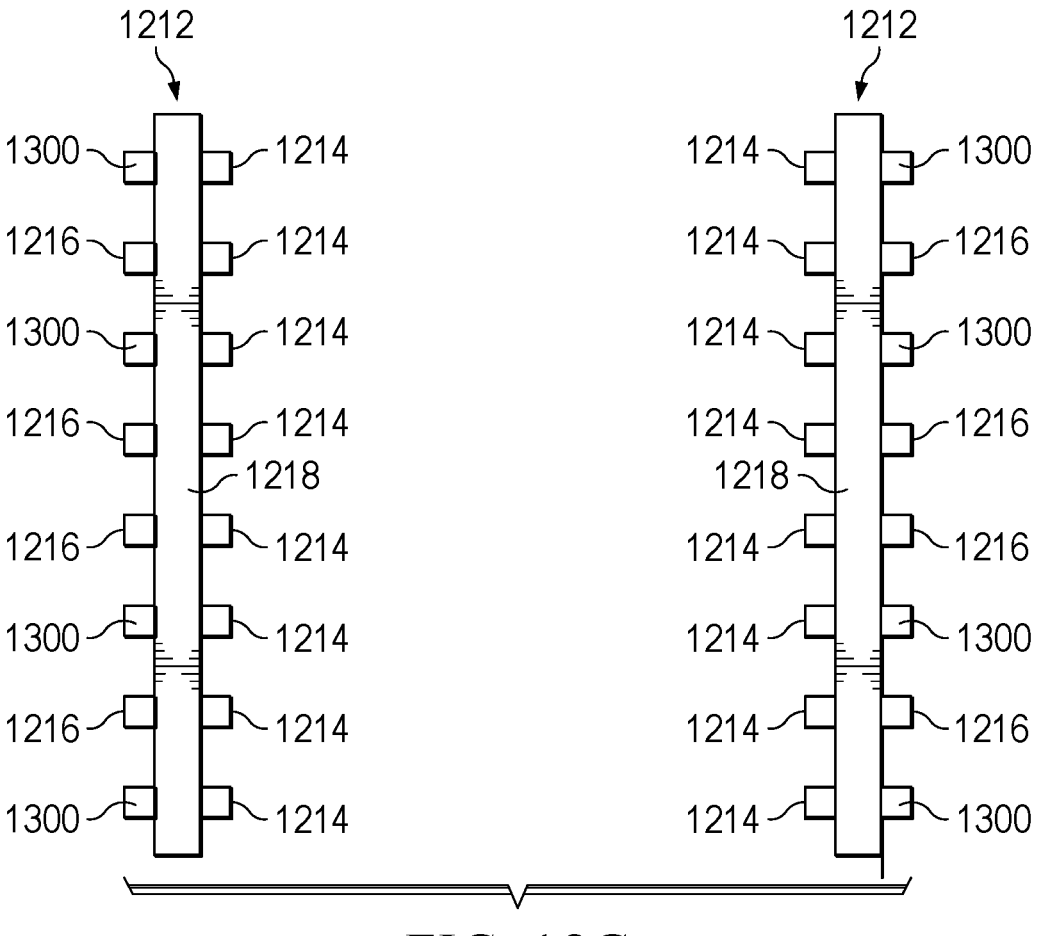

FIGS. 13A-13C provide close-up perspective, profile cross-sectional, and top-down views of an array of conductive pins 1212, respectively, in accordance with various examples. Each conductive pin 1212 includes the first segment 1214, the second segment 1216, and a distal end 1300 suitable for insertion (e.g., press-fitting) into a PCB orifice. A strip of mold compound 1218 couples the conductive pins 1212 in the array to each other. The strip of mold compound 1218 has a vertical thickness ranging from 0.3 mm to 1.5 mm and a horizontal thickness ranging from 1 mm to 3 mm, with thinner mold compound strips resulting in weak coupling and poor maintenance of alignment between the conductive pins 1212 in the array, and with thicker mold compound strips occupying excessive space within semiconductor package 1200 (FIGS. 12A-12C). The first and second segments 1214, 1216 intersect at an angle ranging from 85 degrees to 95 degrees, with an angle smaller than this range being disadvantageous because package size will increase, the PCB assembly process will be unacceptably difficult and the package molding process will also be unacceptably difficult owing to alignment difficulties with the pins and mold chase, and with an angle larger than this range being disadvantageous because the PCB assembly process will be unacceptably difficult and the package molding process will also be unacceptably difficult owing to alignment difficulties with the pins and mold chase.

Figure 14:
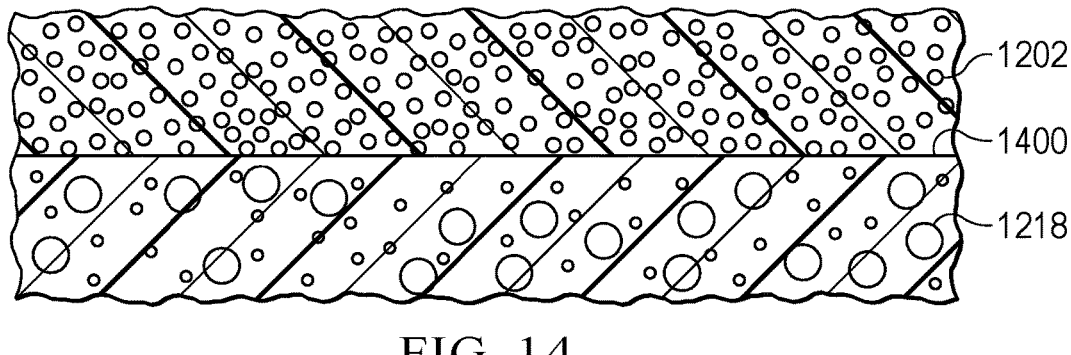
FIG. 14 is an illustration of an example mold compound boundary.

FIG. 14 is a cross-sectional view of the interface 1400 between the strip of mold compound 1218 and the mold compound 1202 (FIGS. 12A-12C). As shown, the mold compounds may have differing grains, thus producing a grain boundary at the interface 1400. The differing grains may result even if the mold compound is composed of the same or similar material, for example, because the mold compounds are applied at different points in the manufacturing process. Although round fillers are shown, in some examples, they may have different shapes or may be absent altogether and the mold compound(s) 1202, 1218 may comprise a resin.

Figure 15A:
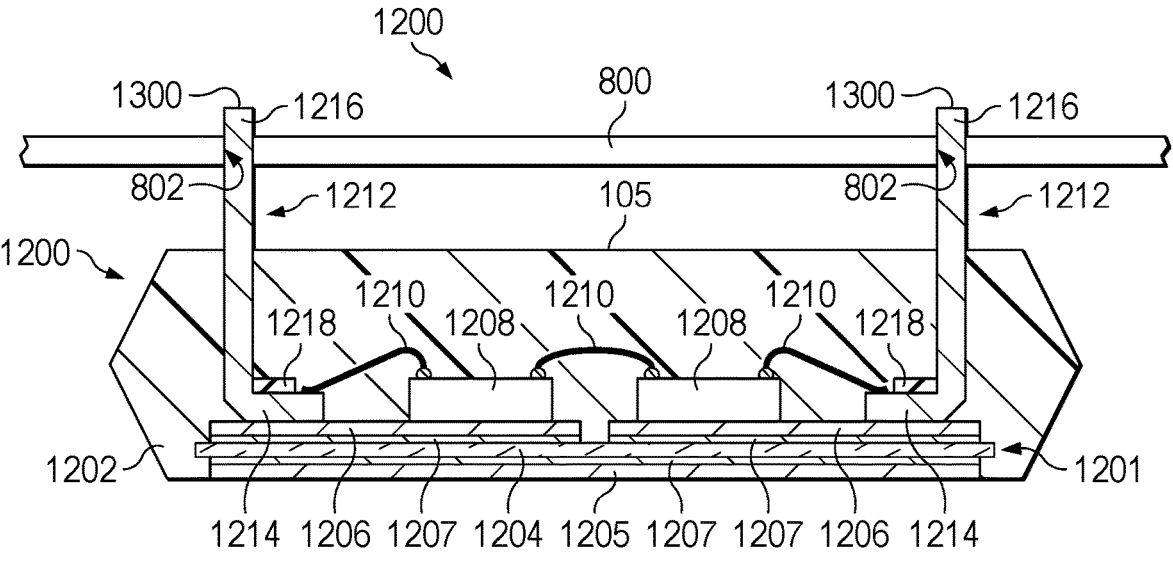
Figure 15B:
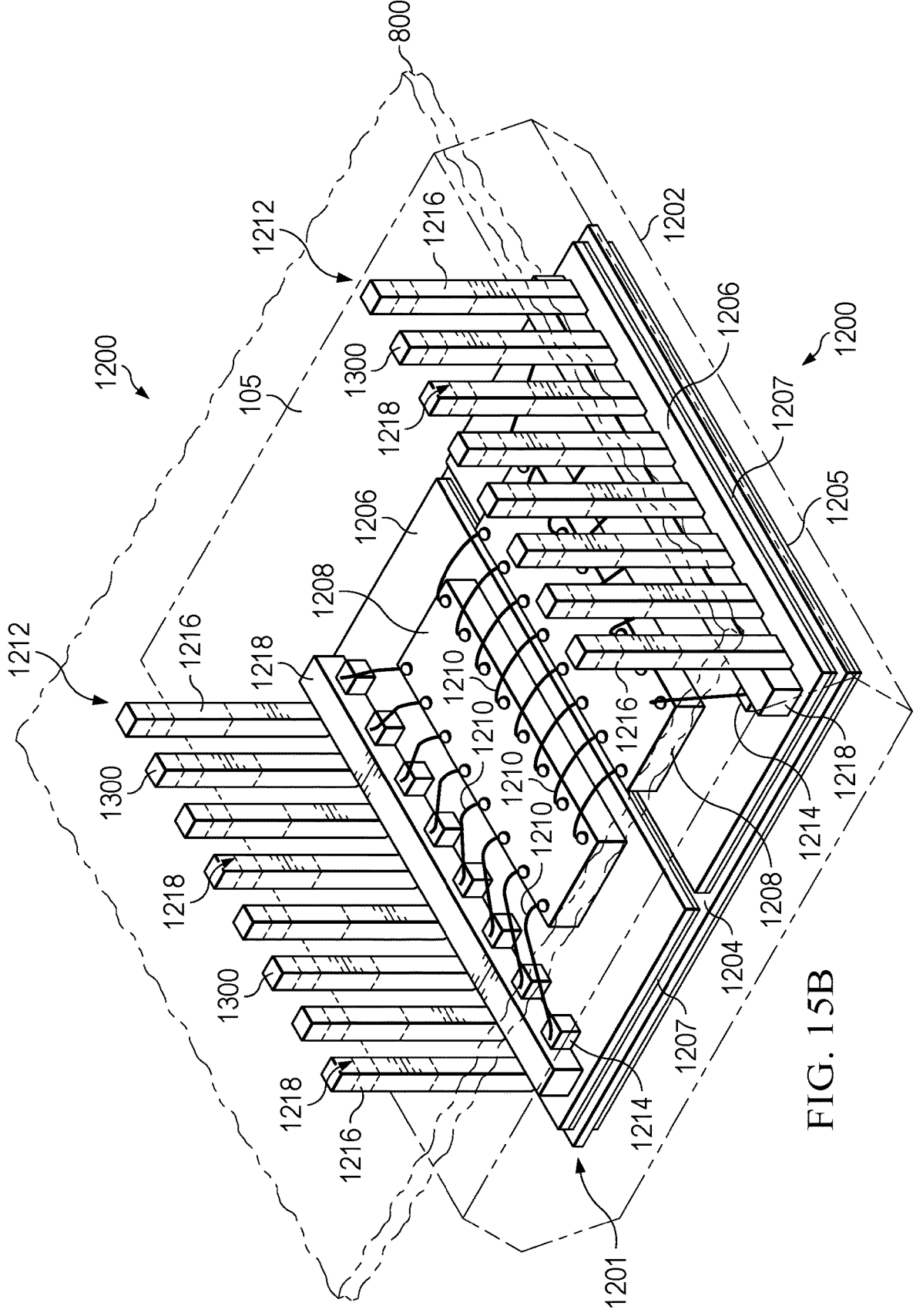

FIGS. 15A-15C are profile cross-sectional, perspective, and close-up cross-sectional views, respectively, of a PCB having an orifice suitable for coupling to vertical conductive pins of a semiconductor package, in accordance with various examples. Specifically, FIG. 15A shows the semiconductor package 1200 coupled to a PCB 800 by way of the conductive pins 1212, and more specifically, by way of the second segments 1216. FIG. 15B is a perspective view of the structure of FIG. 15A. FIG. 15C is a close-up view of the PCB 800 and an orifice 802 of the PCB 800 having a diameter 804. The diameter 804 has the same range as that described above for the diameter 804 with respect to FIG. 8C.

FIG. 16 is a flow diagram of a semiconductor package manufacturing method 1600 in accordance with various examples. FIGS. 17A-17G are a process flow for a semiconductor package manufacturing process, in accordance with various examples. Accordingly, FIGS. 16 and 17A-17G are now described in parallel.

Figure 17A:
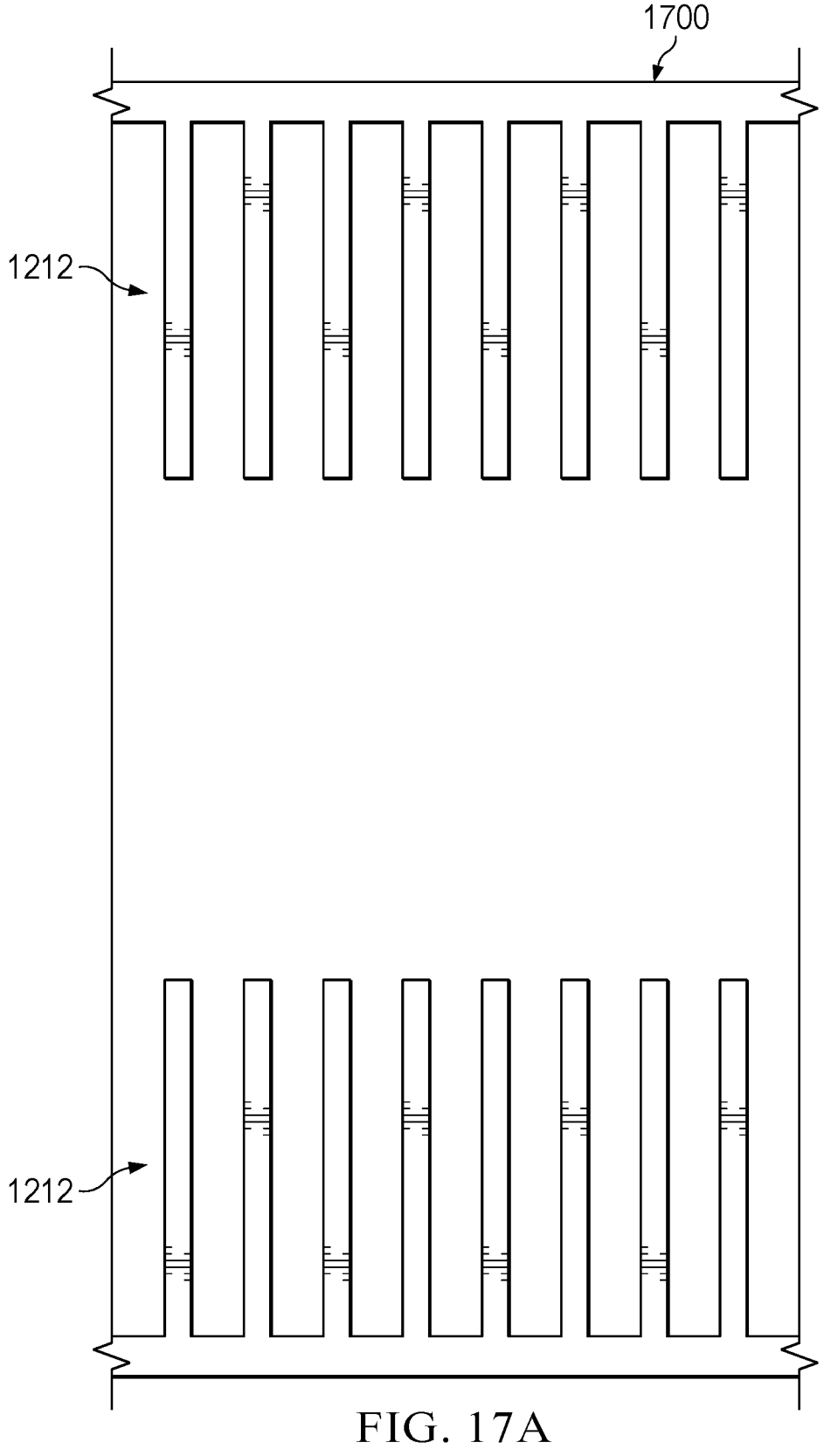
Figure 17B:
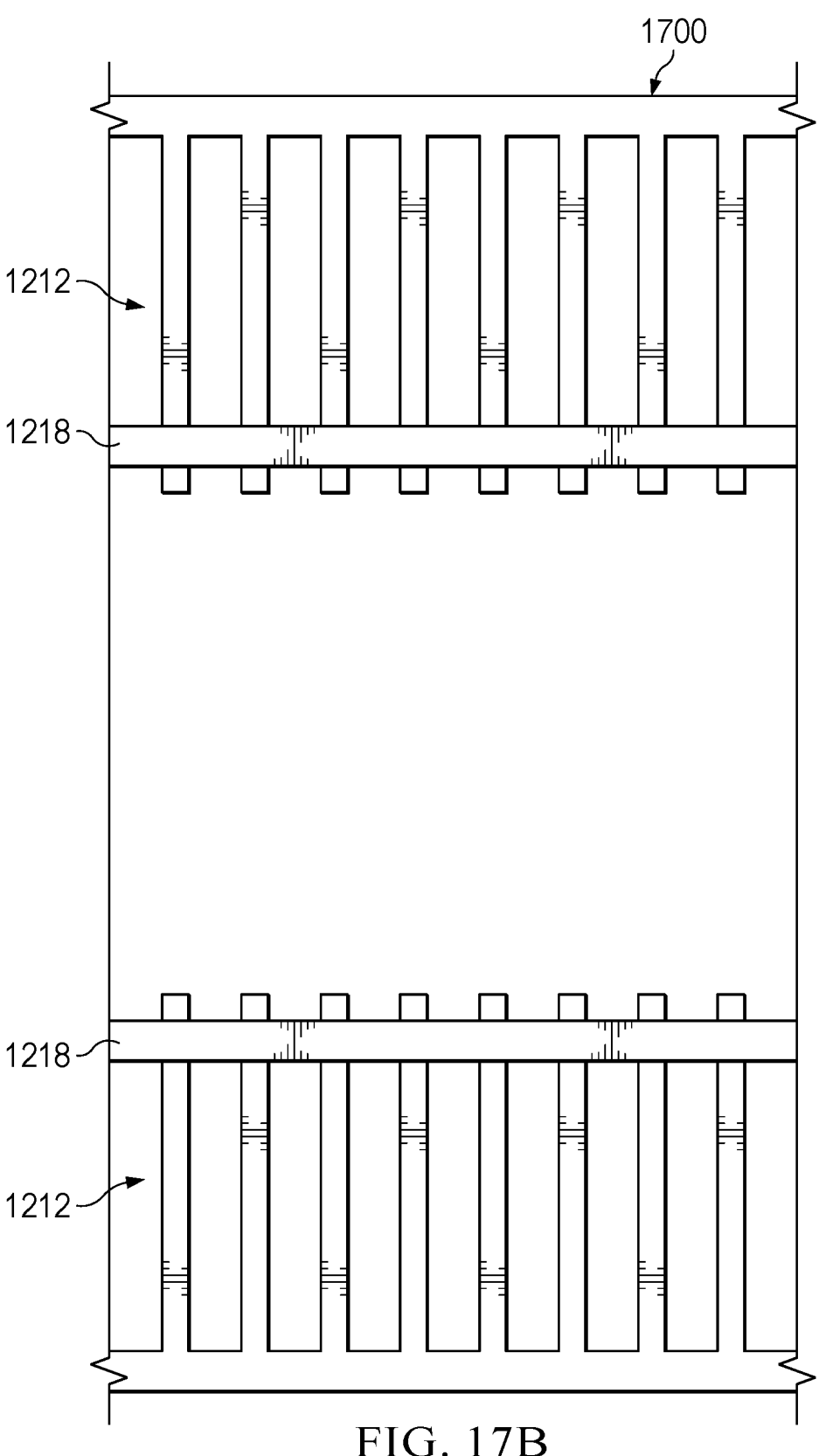

The method 1600 begins with providing a lead frame having multiple conductive pins coupled thereto (1602). FIG. 17A is a top-down view of a lead frame 1700 having conductive pins 1212 coupled thereto. The method 1600 also includes positioning the lead frame with a mold chase and applying a strip of mold compound to the multiple conductive pins along a length of the lead frame (1604). The mold chase may be specifically designed to include a cavity (through which injected mold compound may flow) only along the area of the conductive pins at which the mold compound strip is to be formed. FIG. 17B is a top-down view of the lead frame 1700 having the conductive pins 1212 and mold compound strips 1218 applied to the conductive pins 1212. Although FIGS. 13A-13C show the mold compound strip 1218 coupled to the first segment 1214 of the conductive pin 1212, the mold compound strip 1218 may also be coupled to the second segment 1216 of the conductive pin 1212.

Figure 17C:
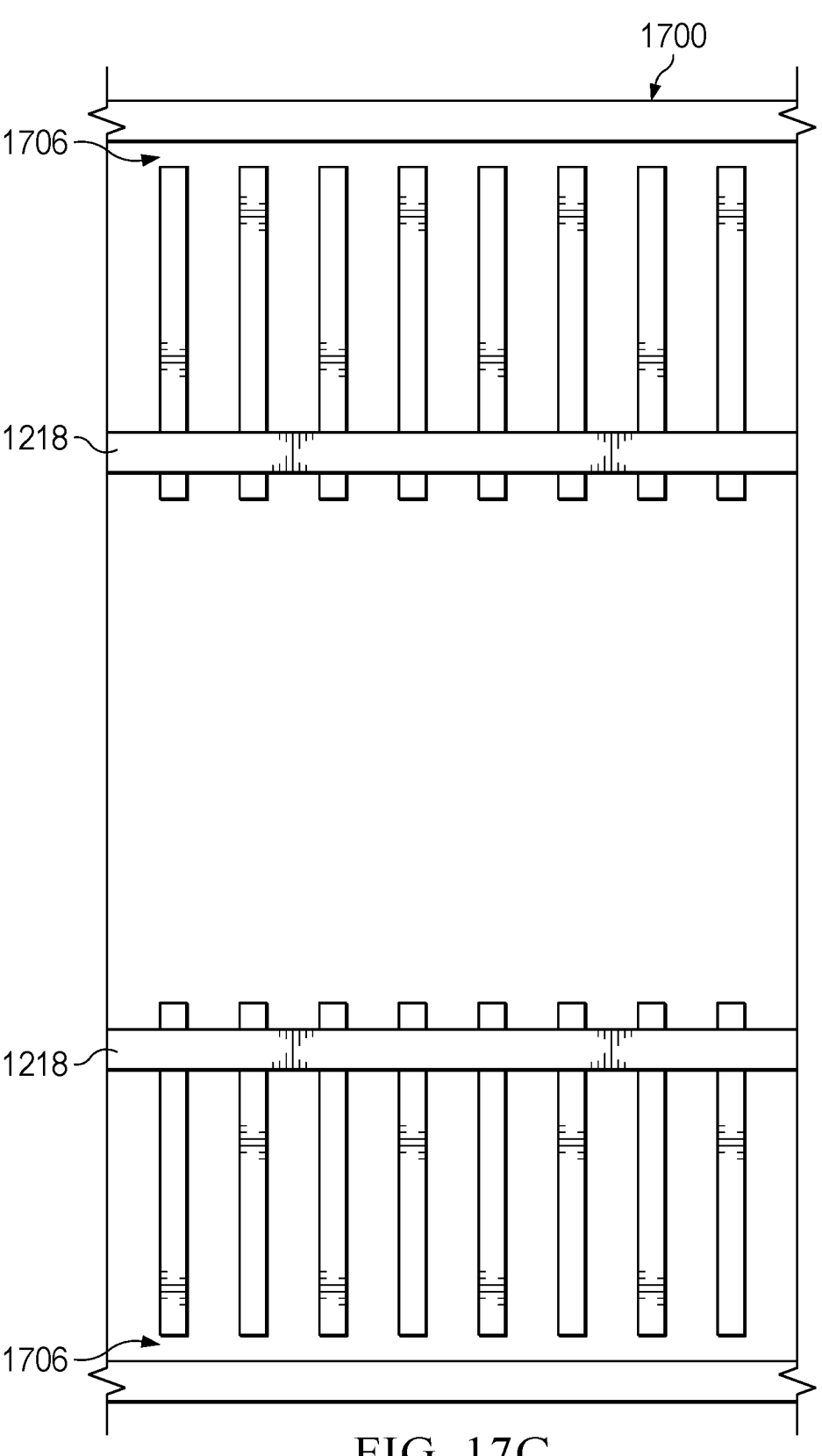

The method 1600 includes trimming connections between the lead frame and the multiple conductive pins (1606). FIG. 17C is a top-down view of the lead frame 1700, with the conductive pins 1212 having been trimmed as indicated by numerals 1706, so that the conductive pins 1212 couple to the lead frame 1700 only by the mold compound strips 1218. The method 1600 includes bending the multiple conductive pins such that each of the multiple conductive pins has first and second segments intersecting at an angle (1608). FIG. 17D1 is a top-down view of the lead frame 1700 with the conductive pins 1212 having been bent to form first and second segments, as shown in FIGS. 13A-13C. In FIG. 17D1, only first segments 1214 are visible, as second segments 1216 extend at an angle relative to the first segments 1214.

The method 1600 includes trimming the mold compound strip to singulate the multiple conductive pins from the lead frame, thereby forming an array of conductive pins (1610). FIG. 17D2 is a top-down view of the structure of FIG. 17D1, except with the mold compound strips 1218 having been trimmed so that each array of conductive pins is singulated from the lead frame 1700.

Figure 17E:
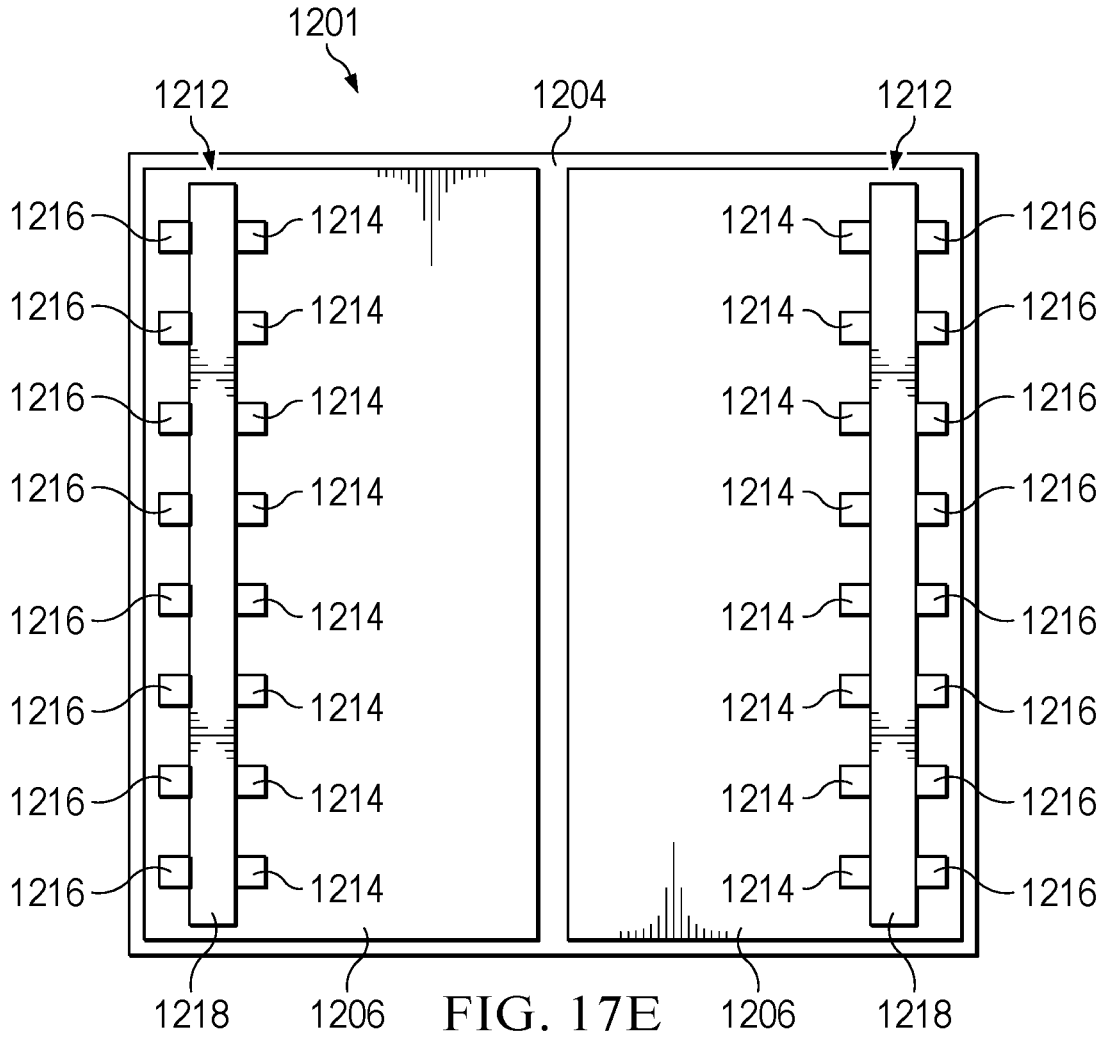
Figure 17F:
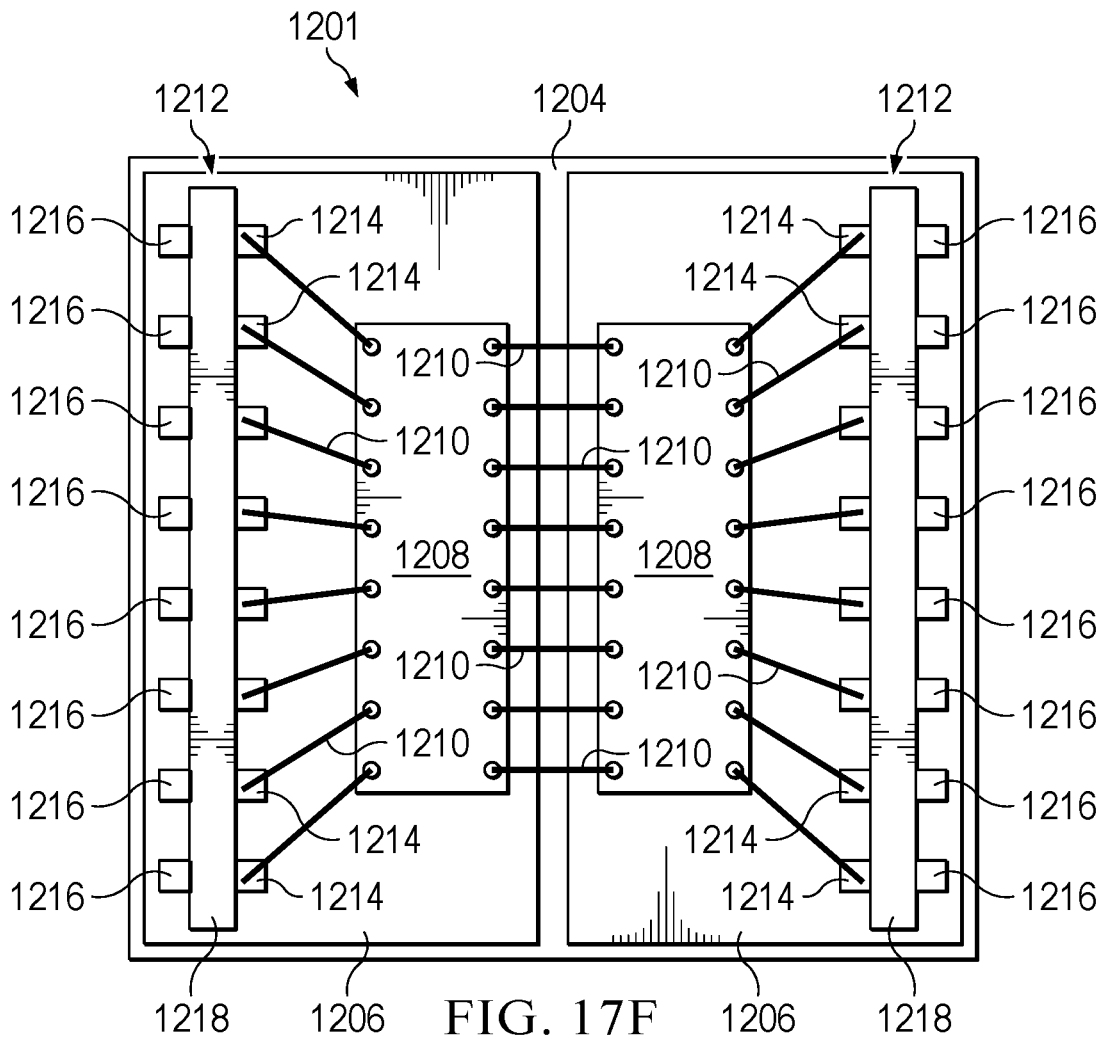
Figure 17G:
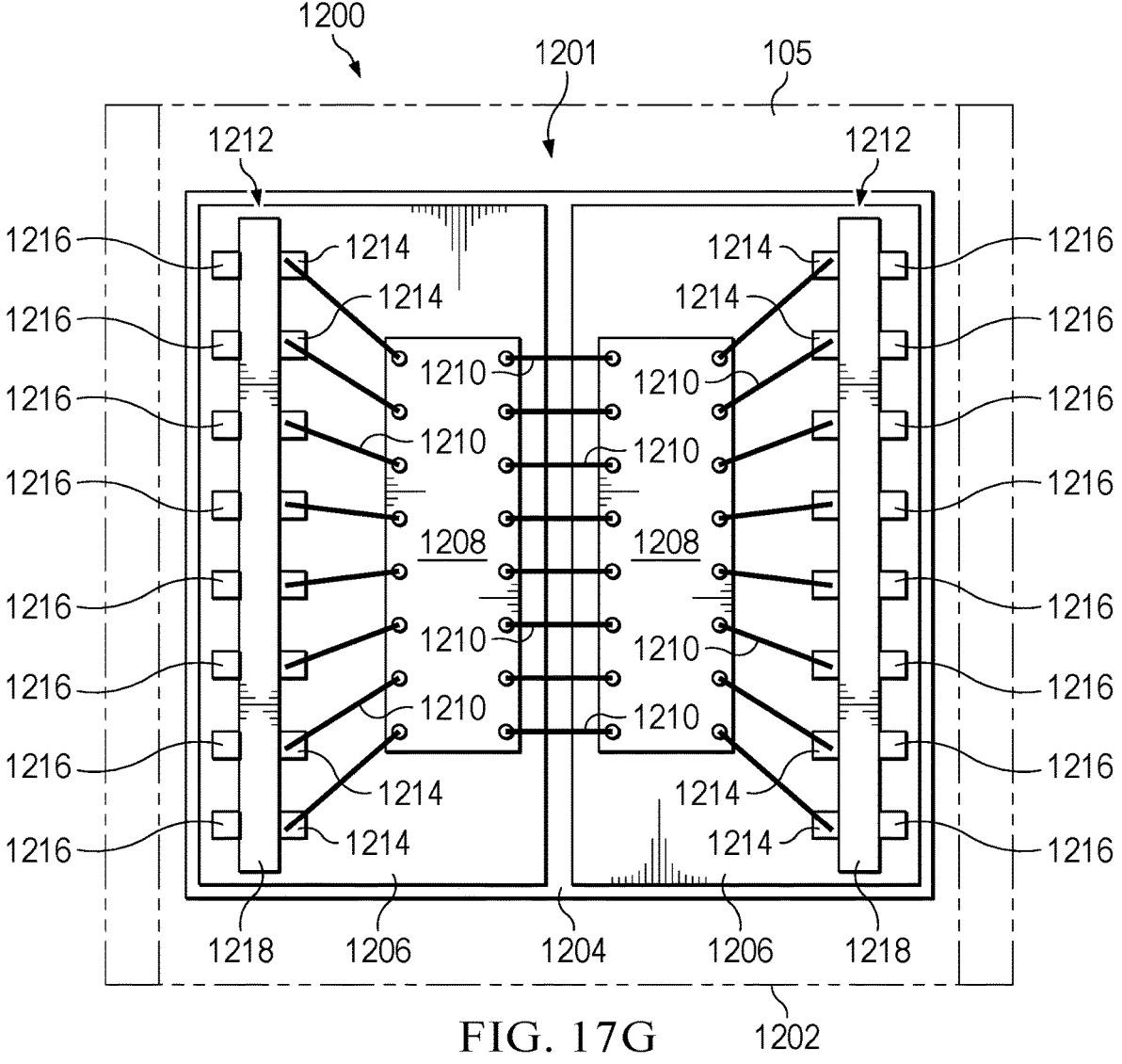

The method 1600 includes coupling an array of conductive pins to a substrate such that the first segments contact the substrate and the second segments extend vertically away from the substrate (1612). FIG. 17E depicts the structure produced by step 1612. The method 1600 also includes coupling a semiconductor die to the substrate (1614). FIG. 17F depicts the structure produced by step 1614. The method 1600 further includes covering the substrate, the semiconductor die, the strip of mold compound, and part of the array of conductive pins with a second mold compound such that portions of the second segments of the conductive pins extend beyond a top surface of the second mold compound (1616). FIG. 17G depicts the structure produced by step 1616.

In some examples, the shape of the distal end of the conductive pin may be formed such that the conductive pin easily and securely connects to a PCB upon insertion into a PCB orifice. For example, the conductive pin may include an anchor structure at a distal end of the pin. The anchor structure is deformed when inserted into a PCB orifice. Specifically, the anchor structure is deformed in such a way that the anchor structure is anchored to the PCB after insertion into the PCB orifice, thereby forming a strong and secure connection to the PCB.

Figure 18A:
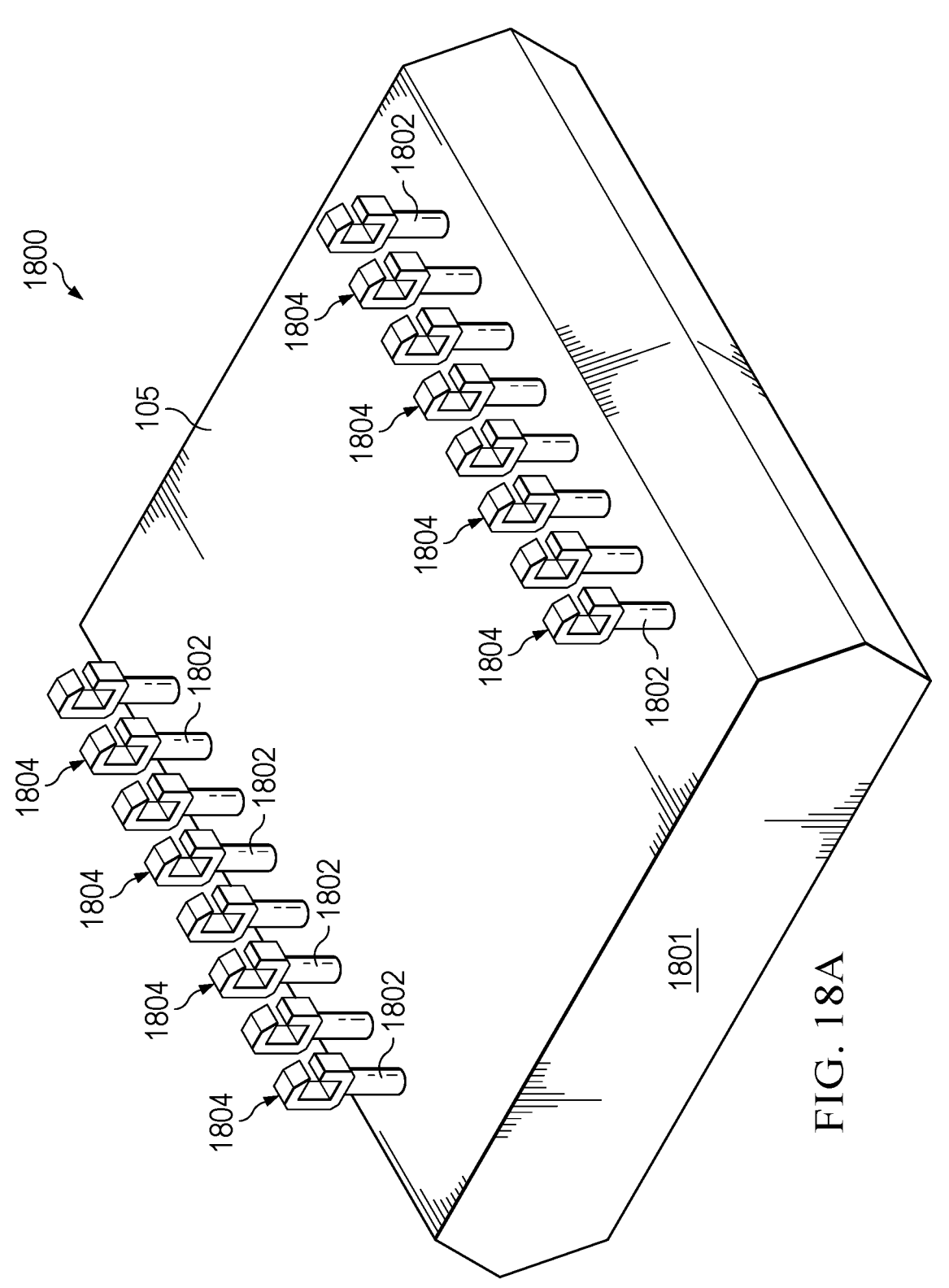
FIGS. 18A-18C are perspective, profile cross-sectional, and top-down views of a semiconductor package having conductive pins with anchor structures, in accordance with various examples.
Figures 18B, 18C:
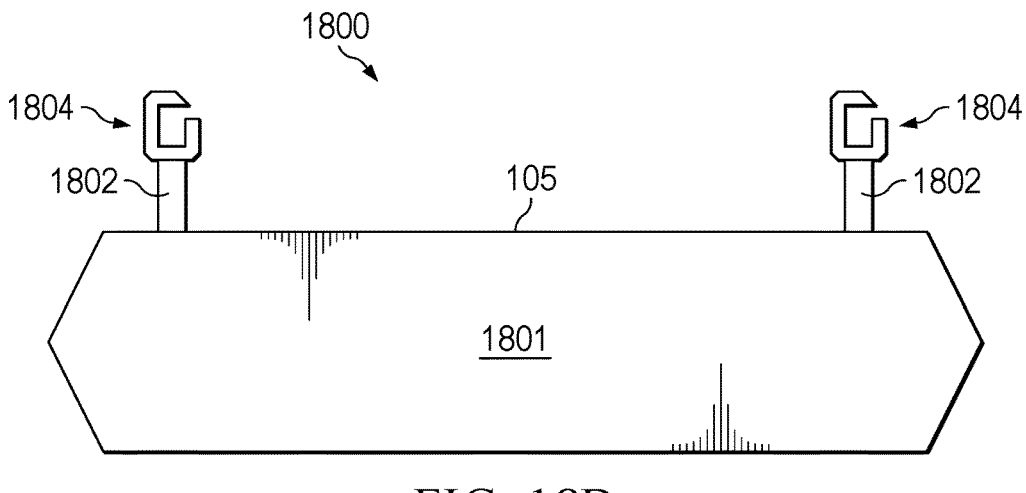

FIGS. 18A-18C are perspective, profile cross-sectional, and top-down views of a semiconductor package 1800 having conductive pins with anchor structures, in accordance with various examples. Specifically, the semiconductor package 1800 includes conductive pins 1802 that extend beyond a top surface of a mold compound 1801. The conductive pins 1802 include anchor structures 1804 at the distal ends of the conductive pins 1802. As described in detail below, the anchor structures 1804 include a first horizontal member having first and second ends, a second horizontal member having first and second ends, a first vertical member having first and second ends, and a second vertical member having first and second ends. The first end of the first horizontal member and the first end of the first vertical member intersect, the second end of the first horizontal member and the first end of the second vertical member intersect, the second end of the first vertical member and the first end of the second horizontal member intersect, and the second end of the second horizontal member and the second end of the second vertical member do not intersect. When inserted into a suitably-sized PCB orifice that is narrower than the width of the anchor structure 1804, the anchor structure 1804 is deformed in such a way that the second end of the second horizontal member is anchored to the PCB. Forces ordinarily applied to the PCB, anchor structure, conductive pin, or package during the course of manufacture and use will fail to dislodge the anchor structure from the PCB orifice. Thus, the anchor structure provides a firm and strong connection to the PCB.

Figure 19A:
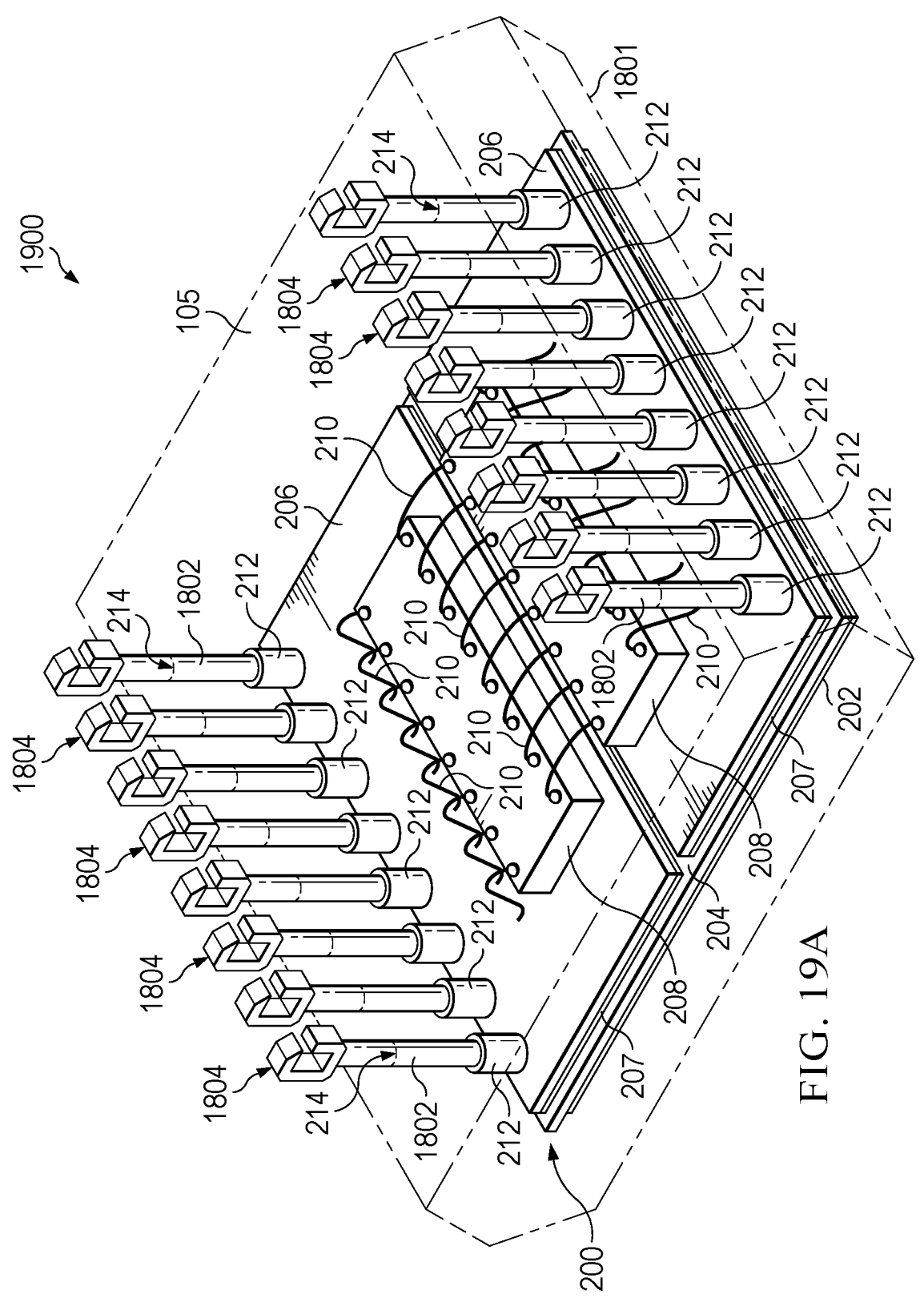
FIGS. 19A-19C are perspective, profile cross-sectional, and top-down views of contents of a semiconductor package having conductive sockets and conductive pins with anchor structures, in accordance with various examples.
Figures 19B, 19C:
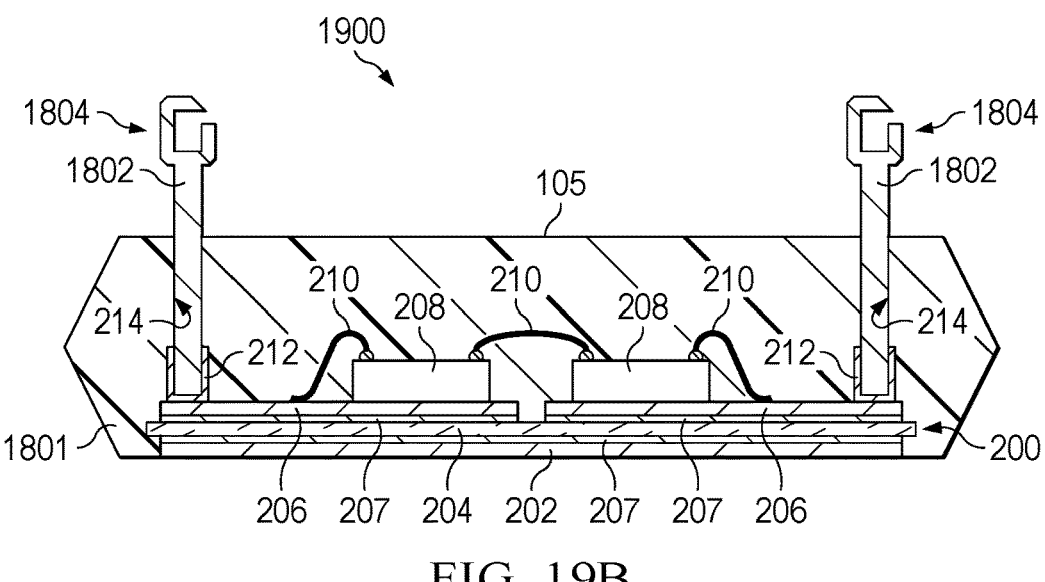

In some examples, conductive pins that include distal ends with anchor structures are supported by conductive sockets, such as the conductive sockets 212 of FIG. 2B. FIGS. 19A-19C are perspective, profile cross-sectional, and top-down views of contents of a semiconductor package 1900 having conductive sockets and conductive pins with anchor structures, in accordance with various examples. Specifically, the semiconductor package 1900 is identical to the semiconductor package 100 of FIG. 2B, except that the distal ends of the conductive pins 1802 include the anchor structures 1804.

Figure 20A:
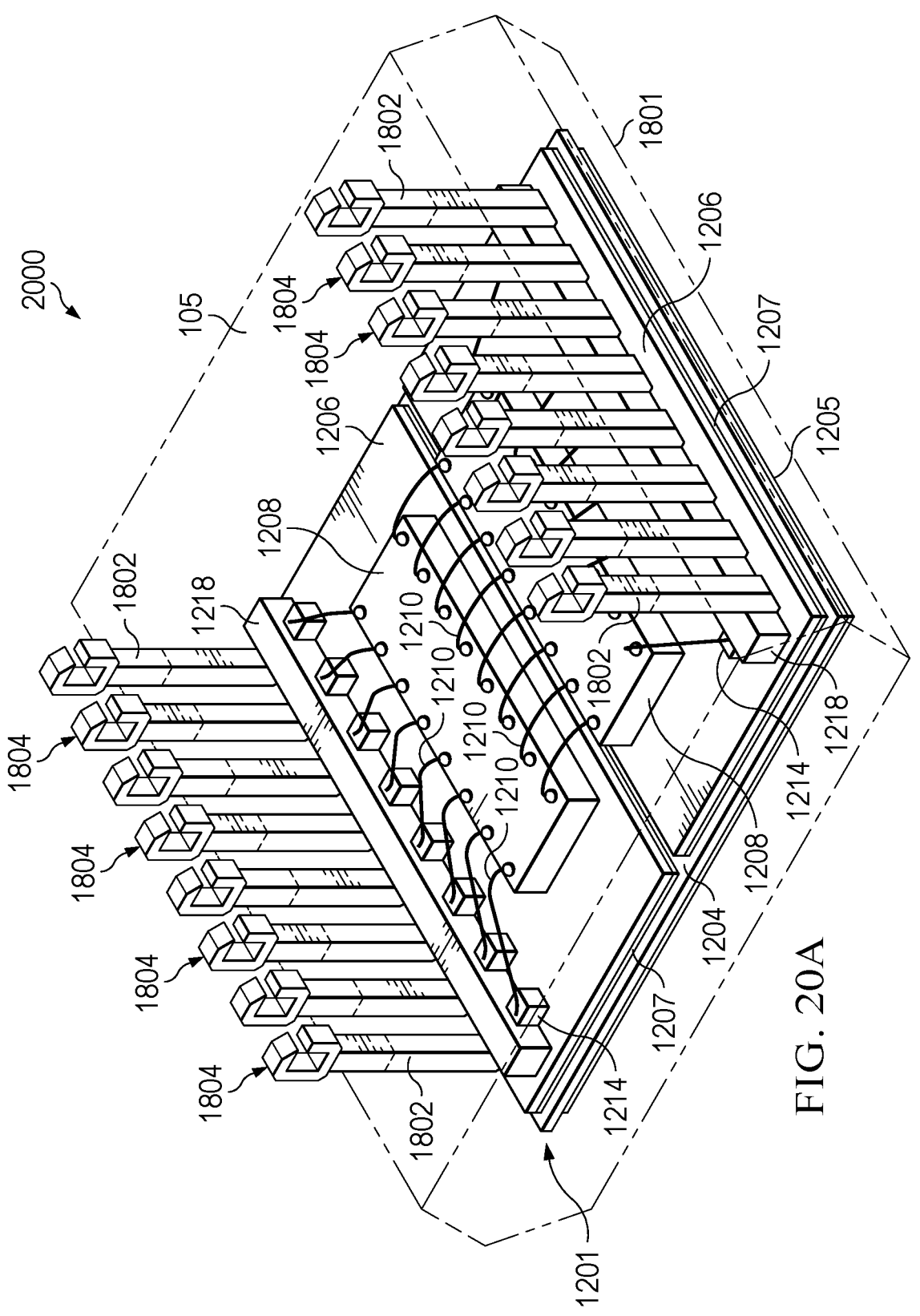
FIGS. 20A-20C are perspective, profile cross-sectional, and top-down views of contents of a semiconductor package having conductive pins with mold compound strips and anchor structures, in accordance with various examples.
Figures 20B, 20C:
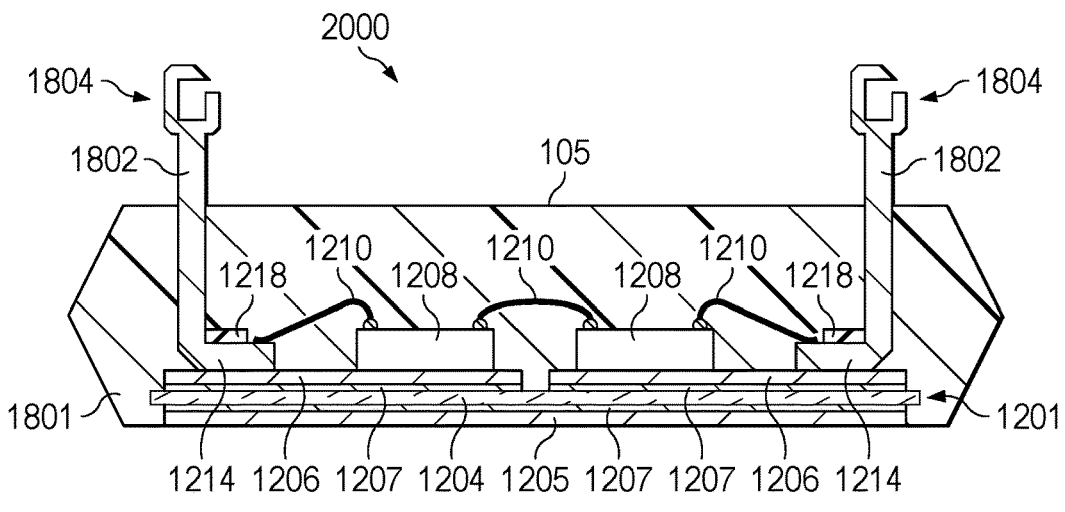

In some examples, conductive pins that include distal ends with anchor structures have first and second segments, with one of the segments coupled (e.g., soldered) to a metal layer of the substrate, as shown in FIG. 12B. FIGS. 20A-20C are perspective, profile cross-sectional, and top-down views of contents of a semiconductor package 2000 having conductive pins 1802 with mold compound strips 1218 and anchor structures 1804, in accordance with various examples. The semiconductor package 2000 is identical to the semiconductor package 1200 of FIG. 12B except that the distal ends of the conductive pins 1802 include the anchor structures 1804.

Figure 21A:
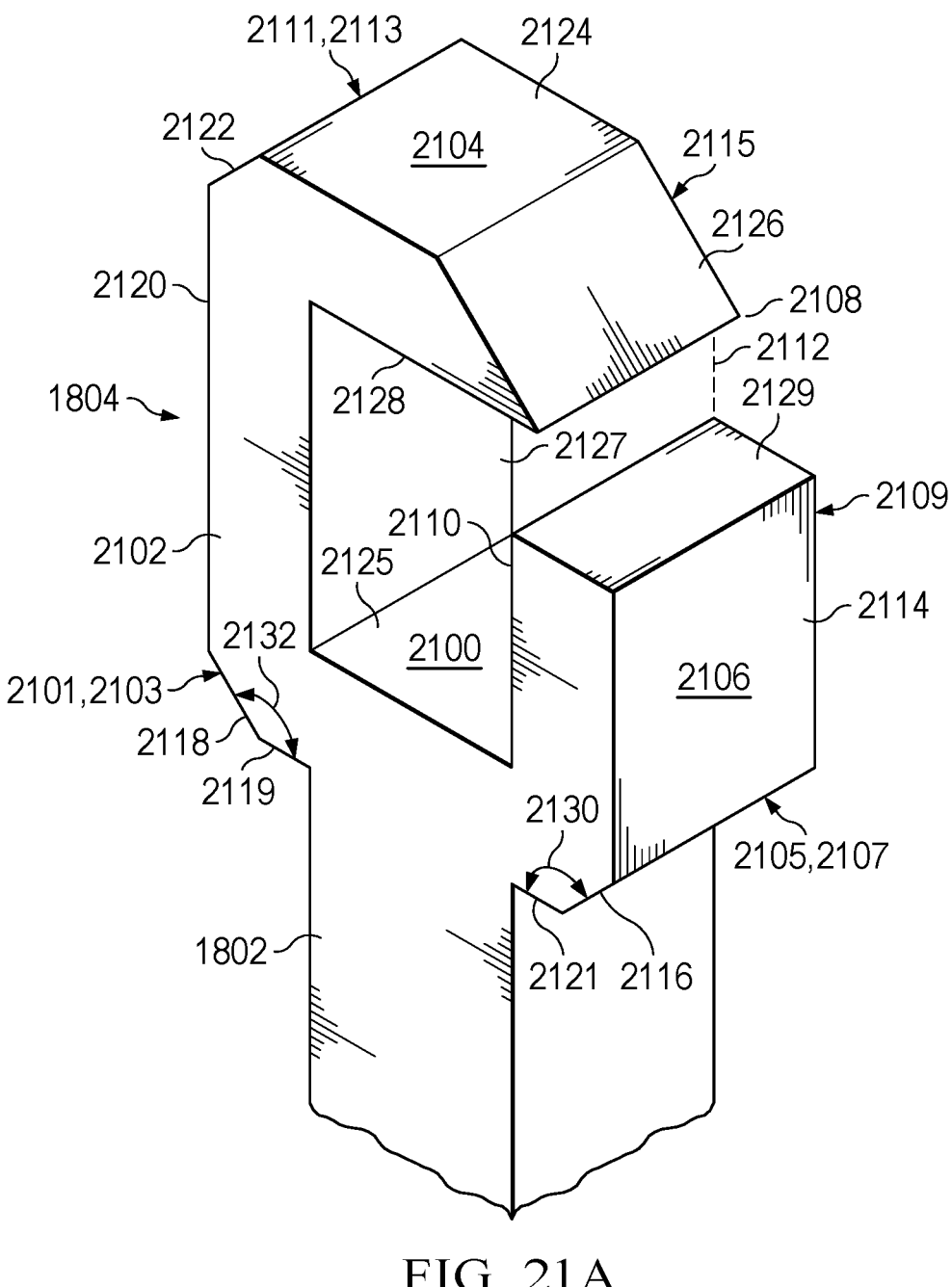
FIGS. 21A-21C are perspective, profile cross-sectional, and top-down views of an anchor structure of a conductive pin, in accordance with various examples.
Figure 21B:
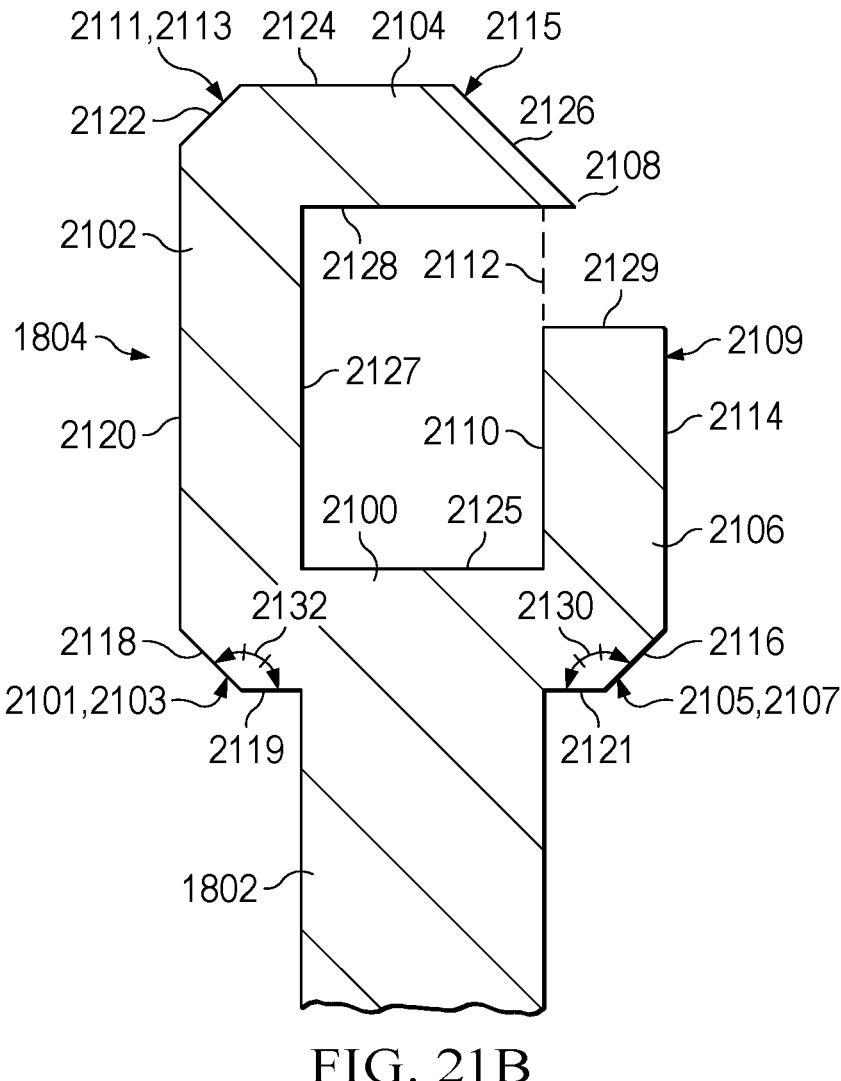
Figure 21C:
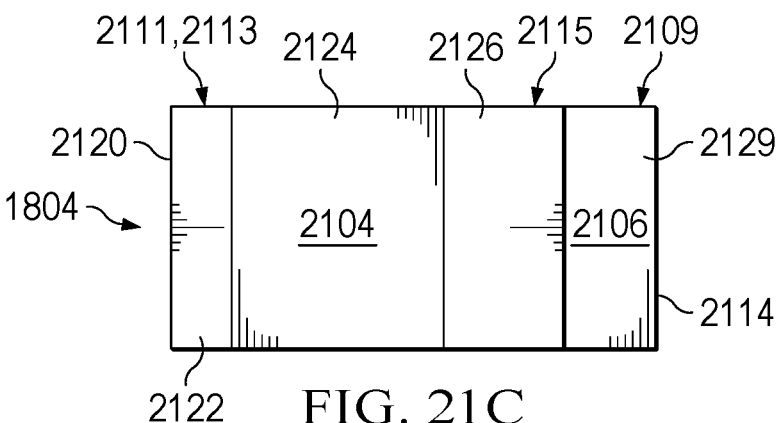

FIGS. 21A-21C are perspective, profile cross-sectional, and top-down views of an anchor structure 1804 of a conductive pin 1802, in accordance with various examples. The anchor structure 1804 includes a first horizontal member 2100 having first and second ends 2101, 2105, a second horizontal member 2104 having first and second ends 2111, 2115, a first vertical member 2102 having first and second ends 2103, 2113, and a second vertical member 2106 having first and second ends 2107, 2109. The first end 2101 of the first horizontal member 2100 and the first end 2103 of the first vertical member 2102 intersect, the second end 2105 of the first horizontal member 2100 and the first end 2107 of the second vertical member 2106 intersect, the second end 2113 of the first vertical member 2102 and the first end 2111 of the second horizontal member 2104 intersect, and the second end 2115 of the second horizontal member 2104 and the second end 2109 of the second vertical member 2106 do not intersect.

In examples, the intersection of the first horizontal member 2100 and the first vertical member 2102 includes an outer edge 2118 that forms an angle 2132 with an edge 2119. The intersection of the first horizontal member 2100 and the second vertical member 2106 includes an outer edge 2116 that intersects with an edge 2121 at an angle 2130.

The anchor structure 1804 includes outer edges 2119, 2121, 2116, 2114, 2129, 2126, 2124, 2122, 2120, and 2128. Further, the anchor structure 1804 includes inner edges 2128, 2127, 2125, and 2110. The edges 2119, 2121, 2125, 2129, 2128, and 2124 are parallel with each other. The edges 2120, 2127, 2110, and 2114 are parallel with each other. The second end 2115 of the second horizontal member 2104 terminates at an anchor tip 2108. The edges 2110 and 2125 are orthogonal to each other. The edges 2125 and 2127 are orthogonal to each other. The edges 2127 and 2128 are orthogonal to each other.

The anchor structure 1804 is composed of a metal or metal alloy, such as copper or aluminum, that can be deformed as described herein but that retains its ability to remain anchored in PCB orifices. The individually horizontal and vertical members of the anchor structure 1804 have dimensions, including a thickness ranging from 0.5 mm to 2 mm and lengths ranging from 1 mm to 5 mm, that permit deformation as described herein but that retain the anchor structure's ability to remain anchored in PCB orifices. Thickness or lengths lower than these ranges are disadvantageous because they result in weakened binding strength between the package and the PCB, and thicknesses or lengths above these ranges are disadvantageous because deformation becomes unacceptably difficult and damages the PCB.

Figure 22A:
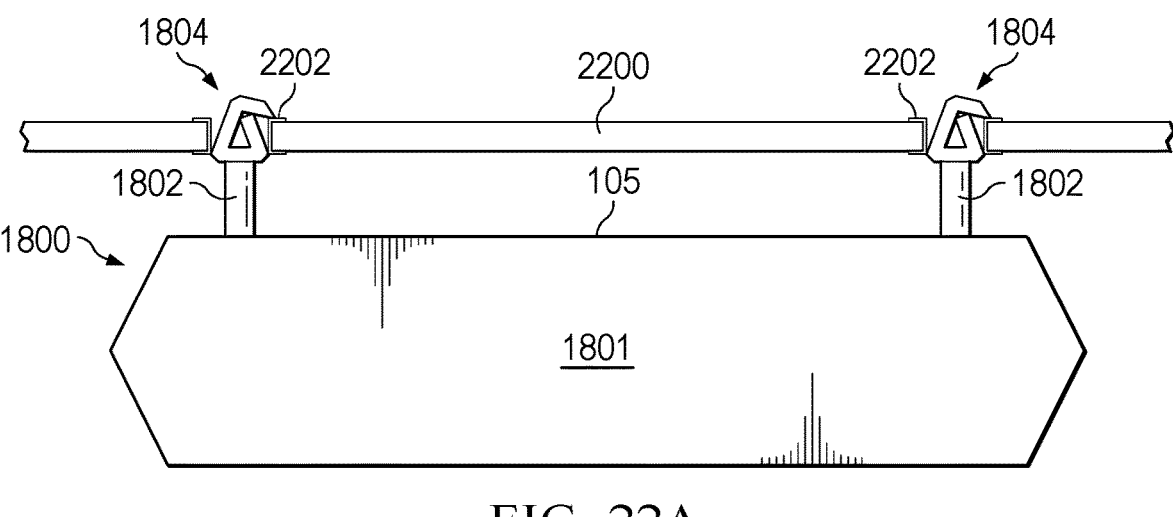
FIGS. 22A and 22B are profile and perspective views of a semiconductor package coupled to a PCB by way of conductive pins, in accordance with various examples.
Figure 22B:
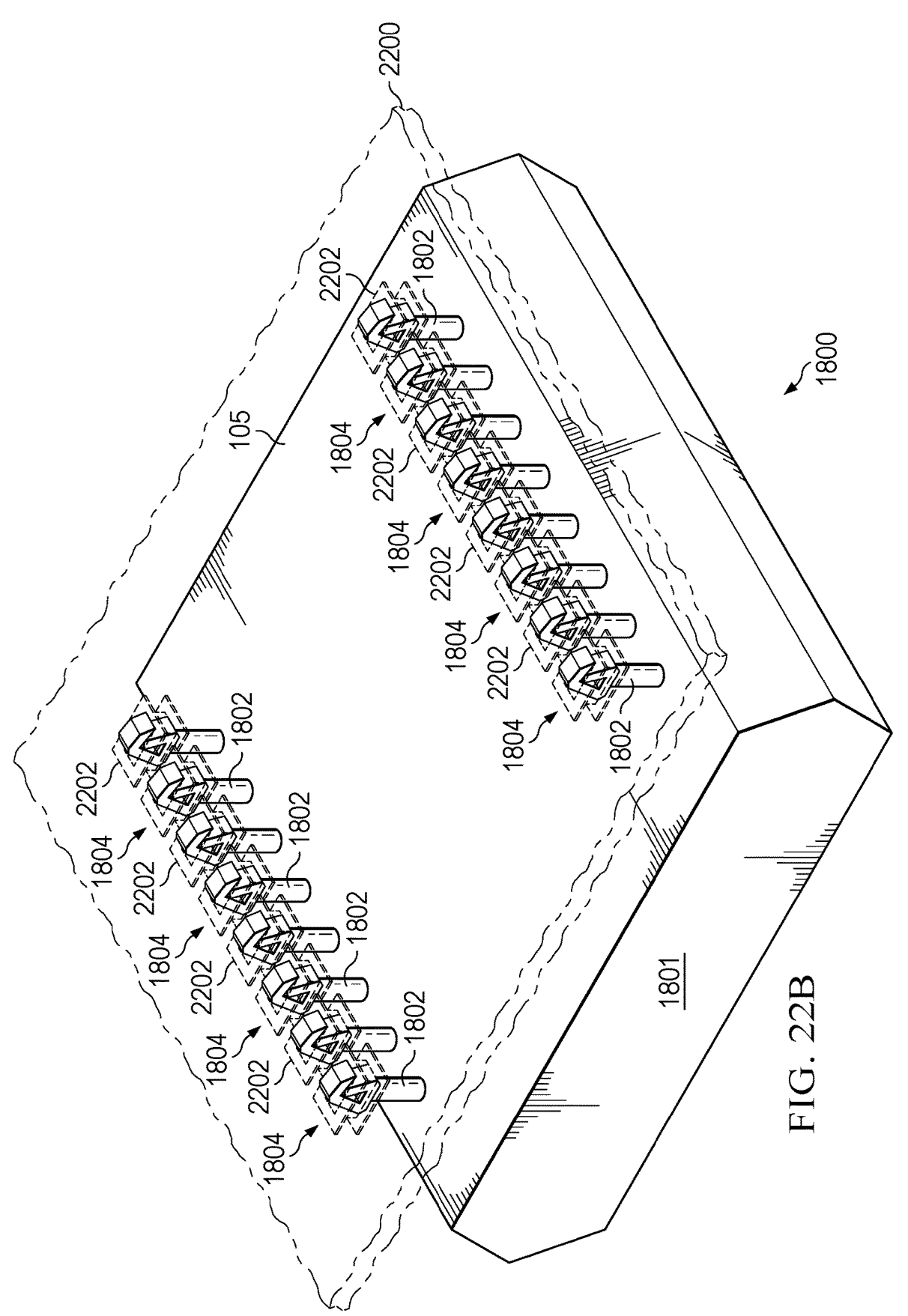
Figure 23A:
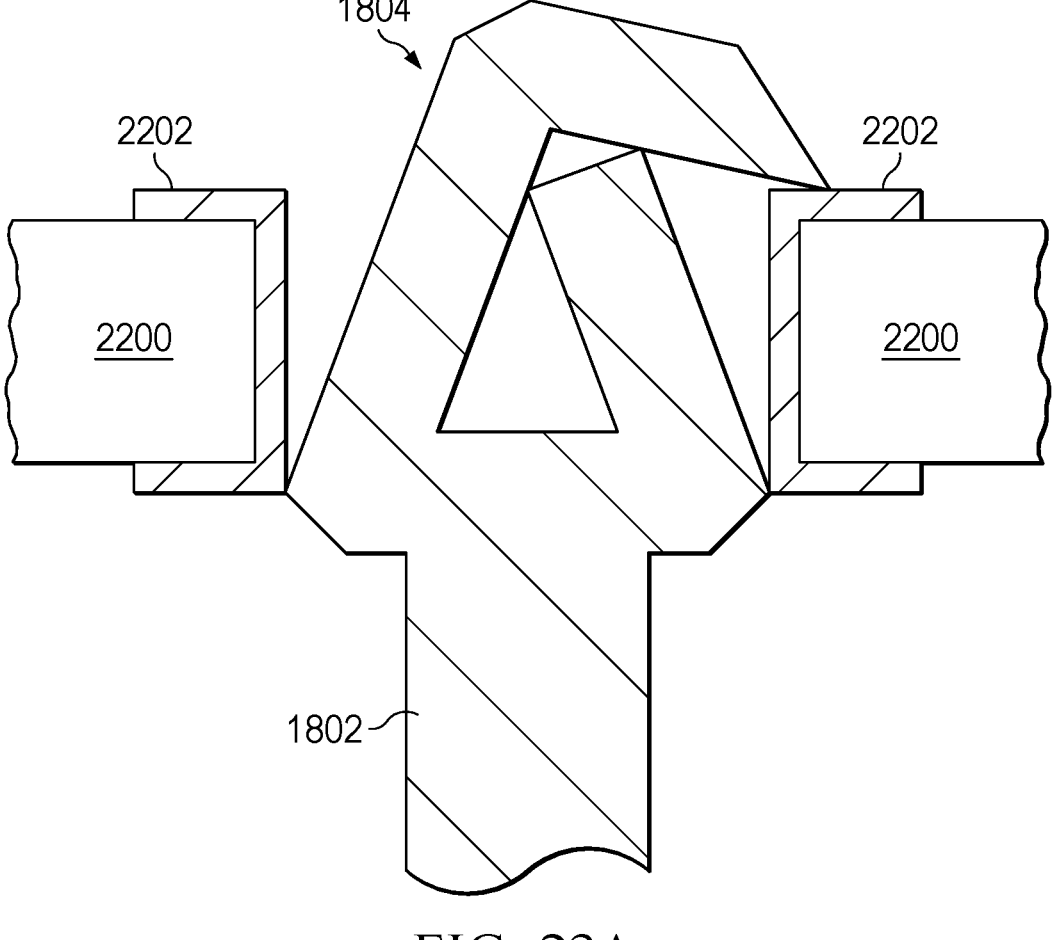
FIGS. 23A-23C are profile cross-sectional, perspective, and top-down views of a deformed conductive pin anchor structure coupled to a PCB orifice, in accordance with various examples.
Figure 23B:
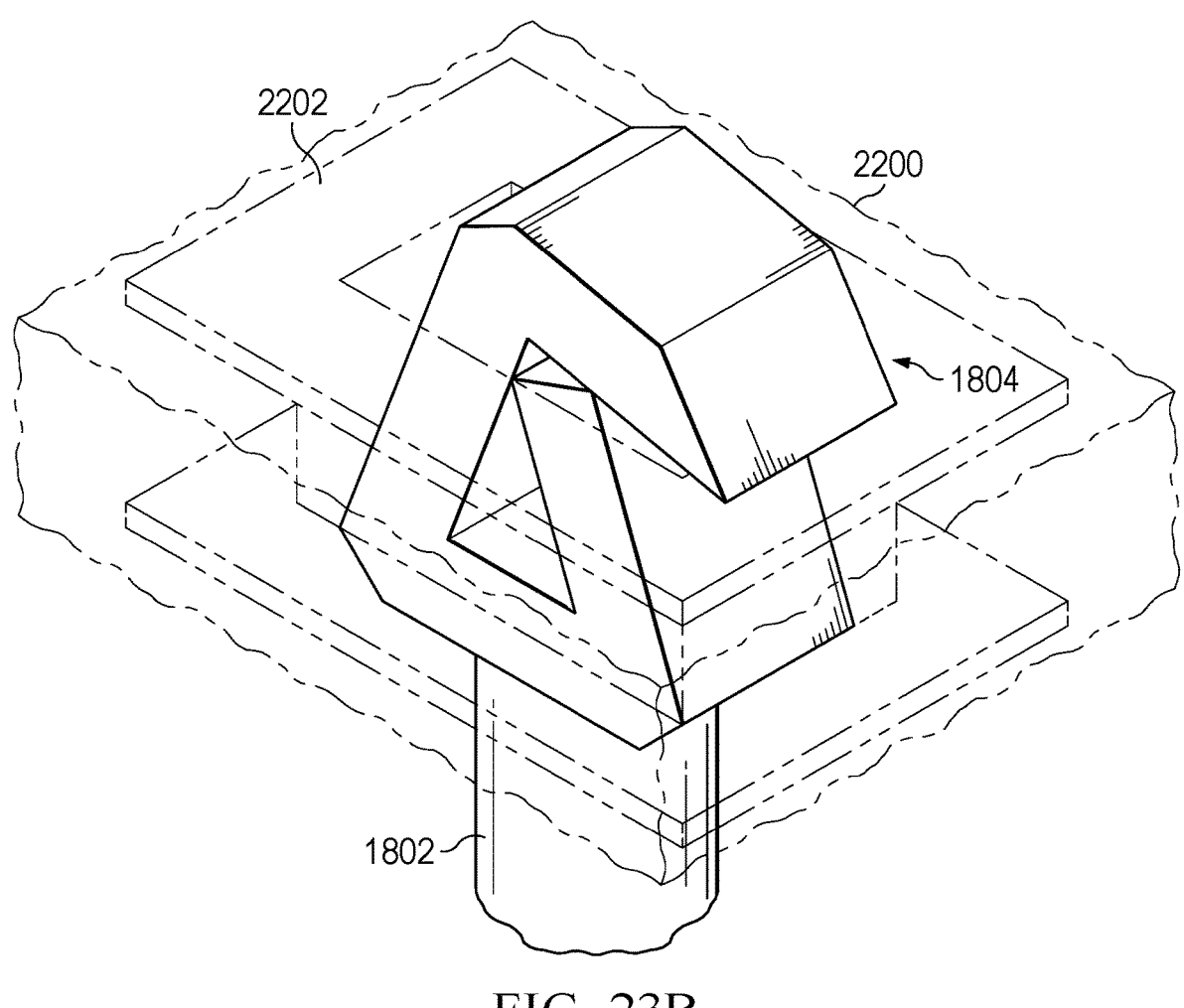
Figures 23C, 24:
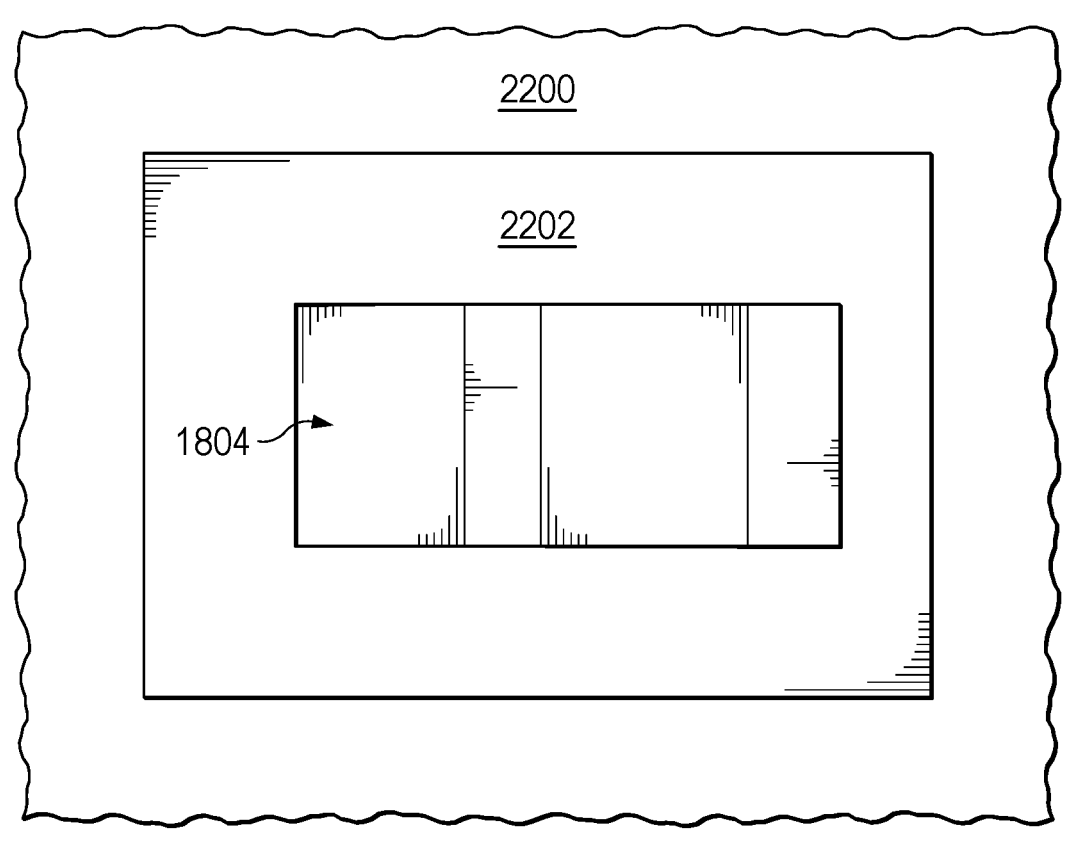
FIG. 24 is a block diagram of an electronic device comprising a semiconductor package coupled to a PCB, in accordance with various examples.

FIGS. 22A and 22B are profile and perspective views of a semiconductor package 1800 coupled to a PCB 2200 by way of conductive pins 1802, in accordance with various examples. More specifically, the anchor structures 1804 of the conductive pins 1802 are inserted into PCB orifices as shown, with the PCB orifices being lined with a metal 2202 that couples to other metal (e.g., metal traces) on the PCB to facilitate the exchange of signals or power. FIGS. 23A-23C are profile cross-sectional, perspective, and top-down close-up views of a deformed conductive pin anchor structure 1804 coupled to a PCB orifice, in accordance with various examples. As shown, insertion of the anchor structure 1804 into the PCB orifice causes the first horizontal member 2100 to be compressed, the first and second vertical members 2102, 2106 to be bent toward each other, and the second horizontal member 2104 to be bent downward and toward the second vertical member 2106, as shown. The lack of a direct connection between the ends 2109, 2115 enables the anchor tip 2108 to anchor to the top surface of the PCB 2200, as shown. Subsequent attempts of reasonable force to pull the conductive pin 1802 out of the PCB orifice will fail. The anchor structure 1804 couples to the metal 2202 to facilitate the exchange of signals and power therebetween.

FIG. 24 is a block diagram of an electronic device 2400, in accordance with various examples. The electronic device 2400 includes a PCB 2402 and a semiconductor package 2404 that is press-fit coupled to the PCB 2402. The semiconductor package 2404 may be any of the types of semiconductor packages described herein, or it may be a combination of any of the semiconductor packages described herein. For example, the semiconductor package 2404 may include conductive pins that are inserted into conductive sockets, that are coupled to each other by mold compound strips, that include anchor structures on distal ends of the conductive pins, or a combination thereof. In examples, the electronic device 2400 is a laptop computer, a desktop computer, a notebook, a tablet, a smartphone, an appliance (e.g., refrigerator, microwave oven, dishwasher), a vehicle (e.g., ground vehicle, aircraft, spacecraft), etc.

Unless otherwise stated, "about," "approximately," or "substantially" preceding a parameter means being within +/−10 percent of that parameter. Modifications are possible in the described examples, and other examples are possible within the scope of the claims.

What is claimed is:

1. A method of manufacturing a semiconductor package, comprising:
    providing a lead frame having multiple conductive pins coupled thereto;
    positioning the lead frame within a mold chase and applying a strip of mold compound to the multiple conductive pins along a length of the lead frame;
    trimming connections between the lead frame and the multiple conductive pins;
    bending the multiple conductive pins;
    trimming the strip of mold compound to singulate the multiple conductive pins from each other and from the lead frame to form singulated conductive pins;
    coupling a singulated conductive pin from among the singulated conductive pins to a substrate such that a portion of the strip of mold compound coupled to the singulated conductive pin is in contact with the substrate and such that a segment of the singulated conductive pin extends vertically in a plane that is orthogonal to the substrate;
    coupling a semiconductor die to the substrate; and
    covering the substrate, the semiconductor die, the portion of the strip of mold compound, and part of the singulated conductive pin with a second mold compound, such that a portion of the segment of the singulated conductive pin extends beyond a top surface of the second mold compound.

2. The method of claim 1, wherein the portion of the strip of mold compound has a vertical thickness ranging from 0.3 mm to 1.5 mm.

3. The method of claim 1, wherein the portion of the strip of mold compound has a horizontal thickness ranging from 1 mm to 3 mm.

4. A method for manufacturing a semiconductor package, comprising:
    coupling a non-device side of a semiconductor die to a substrate;
    wirebonding a device side of the semiconductor die to the substrate;
    soldering a conductive socket to the substrate, the conductive socket having a cavity formed therein;
    positioning the substrate and the semiconductor die in a mold chase such that the conductive socket is aligned with an elongate member of the mold chase, the elongate member contacting a bottom surface of the conductive socket;
    applying a mold compound to the semiconductor die, the elongate member preventing the mold compound from entering the cavity and from entering a volume occupied by the elongate member;
    removing the substrate and the semiconductor die from the mold chase; and
    inserting a conductive pin in the volume and press-fitting the conductive pin into the cavity.

5. The method of claim 4, wherein an inner cross-sectional diameter of the conductive socket is 80% to 95% of a cross-sectional diameter of the conductive pin.

6. A semiconductor power package, comprising:
    a substrate;
    a semiconductor die coupled to the substrate;
    a conductive socket soldered to the substrate, the conductive socket having a cavity formed therein;
    a mold compound covering the substrate, the semiconductor die, and the conductive socket; and
    a conductive pin physically contacting an inner surface of the cavity, wherein the conductive pin and the conductive socket are independent structures, the conductive pin extending vertically from the cavity and through the mold compound, the conductive pin extending a distance beyond a top surface of the mold compound, a first portion of the conductive pin having a cross-sectional diameter larger than a cross-sectional diameter of the cavity and larger than a cross-sectional diameter of a second portion of the conductive pin positioned inside the cavity.

7. The package of claim 6, wherein the conductive pin is composed of copper.

8. The package of claim 6, wherein the cross-sectional diameter of the cavity is 80% to 95% of the cross-sectional diameter of the conductive pin.

9. The package of claim 6, wherein the cavity holds an end of the conductive pin, and wherein the end of the conductive pin has a full bullnose shape and a circular cross-section.

10. The package of claim 6, wherein the conductive pin is press-fit in the cavity of the conductive socket.

11. The package of claim 6, wherein the substrate includes a ceramic layer, an aluminum layer, and a copper layer.

12. A semiconductor power package, comprising:
    a substrate;
    a semiconductor die coupled to the substrate;
    a conductive pin having first and second segments, the first segment coupled to the substrate and the second segment in a vertical plane approximately orthogonal to the substrate;
    a first mold compound covering the substrate, the semiconductor die, the first segment, and a portion of the second segment, the second segment terminating a distance beyond a top surface of the first mold compound; and a second mold compound covering at least a portion of the first segment, the first and second mold compounds having a difference in grain pattern.

13. The package of claim 12, wherein the distance beyond the top surface of the first mold compound is at least 2 millimeters.

14. The package of claim 12, wherein the second mold compound has a vertical thickness ranging from 0.3 mm to 1.5 mm.

15. The package of claim 12, wherein the second mold compound has a horizontal thickness ranging from 1 mm to 3 mm.

16. The package of claim 12, further comprising a second substrate and a second semiconductor die on the second substrate, the first and second substrates separated from each other by a gap.

17. A semiconductor power package, comprising:

a substrate;

a semiconductor die coupled to the substrate; and a conductive pin extending vertically in a first plane approximately orthogonal to the substrate, the conductive pin including a distal end having an anchor structure adapted to be coupled to a printed circuit board (PCB) through an orifice in the PCB, the anchor structure including:

a first horizontal member having first and second ends;

a second horizontal member having first and second ends;

a first vertical member having first and second ends; and a second vertical member having first and second ends, wherein the first end of the first horizontal member and the first end of the first vertical member intersect, the second end of the first horizontal member and the first end of the second vertical member intersect, the second end of the first vertical member and the first end of the second horizontal member intersect, and the second end of the second horizontal member and the second end of the second vertical member do not intersect.

18. The package of claim 17, wherein the second vertical member has an outer edge and an inner edge, the outer edge in a first vertical plane and the inner edge in a second vertical plane, the second end of the second horizontal member terminating at a point that is vertically aligned with the second vertical member between the inner and outer edges of the second vertical member.

19. The package of claim 17, wherein the second end of the second horizontal member is tapered.

20. The package of claim 17, wherein the first and second vertical members are configured to bend toward each other as the anchor structure is inserted into the orifice in the PCB.

21. The package of claim 17, wherein the second horizontal member is configured to anchor to a surface of the PCB as the anchor structure is inserted into the orifice in the PCB, and wherein the surface of the PCB faces away from the package.

22. The package of claim 17, wherein the anchor structure has a thickness ranging from 0.5 mm to 2 mm.

23. The package of claim 17, wherein the first horizontal member has a length ranging from 1 mm to 5 mm.

\* \* \* \* \*